United States Patent
Kapoor et al.

(10) Patent No.: US 11,258,420 B2
(45) Date of Patent: Feb. 22, 2022

(54) MUTUALLY INDUCED FILTERS

(71) Applicant: Lam Research Corporation, Fremont, CA (US)

(72) Inventors: Sunil Kapoor, Vancouver, WA (US); Aaron Logan, Battle Ground, WA (US); Hyungjoon Kim, Beaverton, OR (US); Yaswanth Rangineni, Beaverton, OR (US); Karl Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 30 days.

(21) Appl. No.: 16/834,975

(22) Filed: Mar. 30, 2020

(65) Prior Publication Data
US 2020/0252040 A1  Aug. 6, 2020

Related U.S. Application Data

(63) Continuation of application No. 16/036,491, filed on Jul. 16, 2018, now Pat. No. 10,637,427, which is a continuation of application No. 14/884,401, filed on Oct. 15, 2015, now Pat. No. 10,044,338.

(51) Int. Cl.
*H03H 1/00* (2006.01)
*H02M 1/44* (2007.01)

(52) U.S. Cl.
CPC ............ *H03H 1/0007* (2013.01); *H02M 1/44* (2013.01)

(58) Field of Classification Search
CPC ....... H01P 5/12; C23C 16/458; C23C 16/505; C23C 16/52; H03H 7/40
USPC .......................................... 333/17.1
See application file for complete search history.

(56) References Cited

U.S. PATENT DOCUMENTS

| | | | | |
|---|---|---|---|---|
| 4,052,751 A | * | 10/1977 | Shepard | H02H 3/331 361/50 |
| 2012/0032756 A1 | * | 2/2012 | Long | H03H 1/0007 333/181 |
| 2014/0136742 A1 | * | 5/2014 | Ooyabu | G06F 13/364 710/110 |
| 2016/0028362 A1 | * | 1/2016 | Jafarian-Tehrani | H03H 7/06 333/17.1 |

* cited by examiner

Primary Examiner — Hafizur Rahman
(74) Attorney, Agent, or Firm — Penilla IP, APC

(57) ABSTRACT

A mutually induced filter for filtering radio frequency (RF) power from signals supplied to a load is described. The mutually induced filter includes a first portion connected to a first load element of the load for filtering RF power from one of the signals supplied to the first load element. The load is associated with a pedestal of a plasma chamber. The mutually induced filter further includes a second portion connected to a second load element of the load for filtering RF power from another one of the signals supplied to the second load element. The first and second portions are twisted with each other to be mutually coupled with each other to further facilitate a coupling of a resonant frequency associated with the first portion to the second portion.

22 Claims, 15 Drawing Sheets

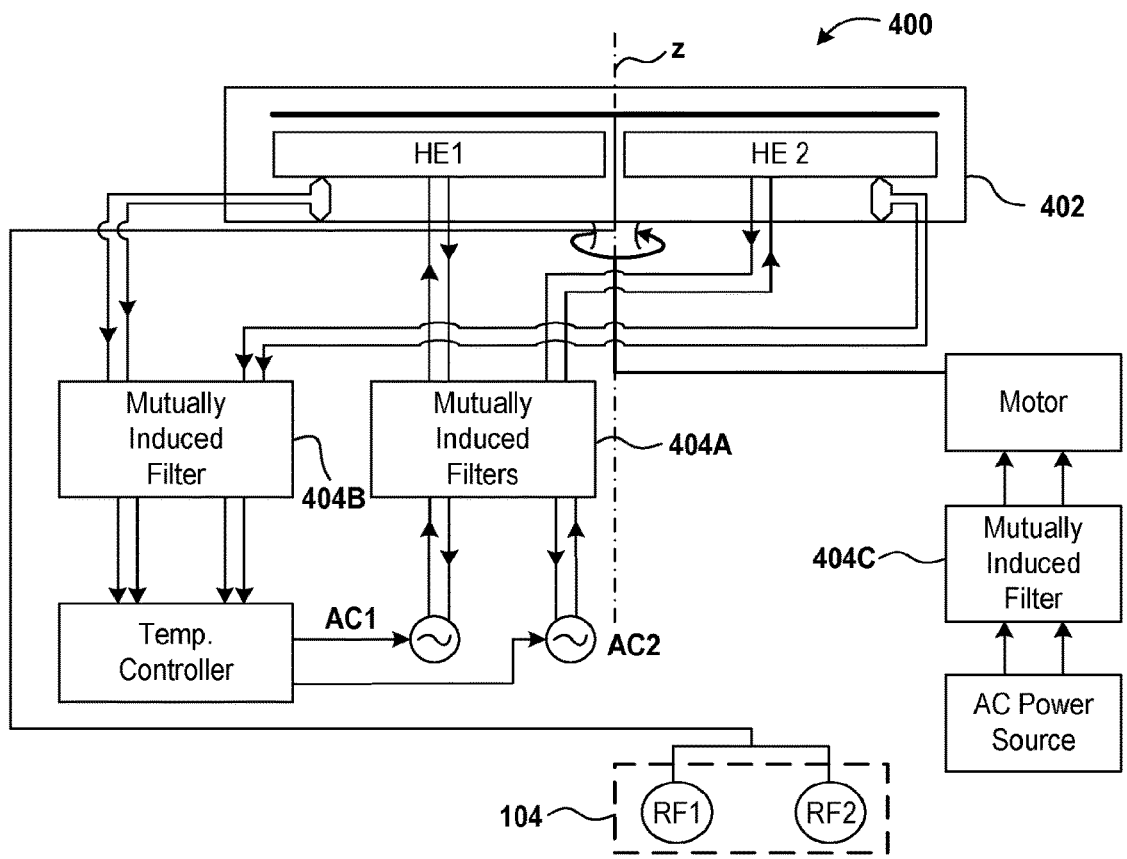
FIG. 4A
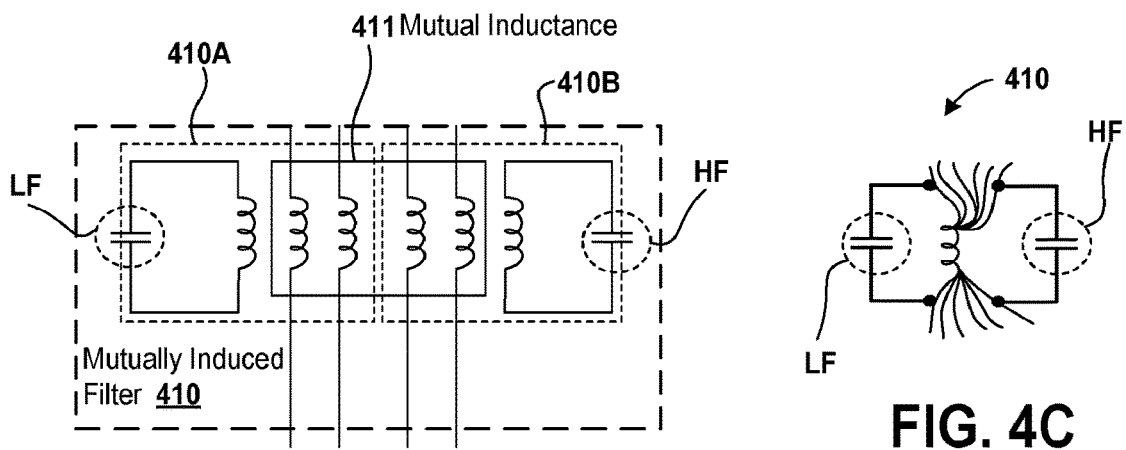
FIG. 4B
FIG. 4C

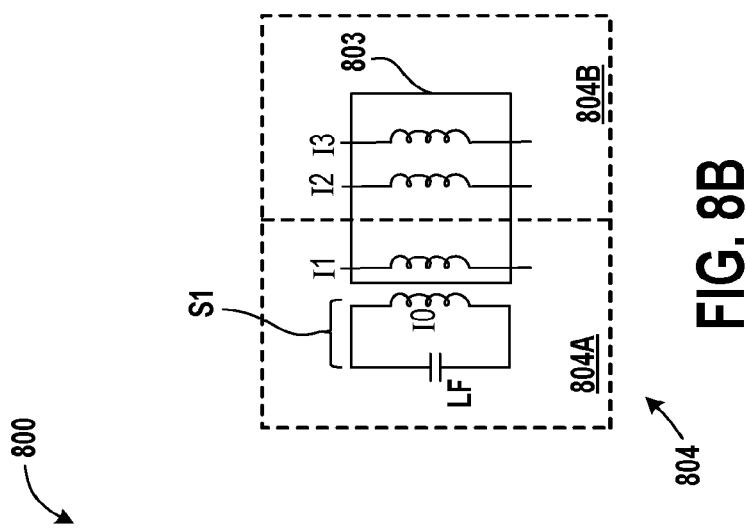
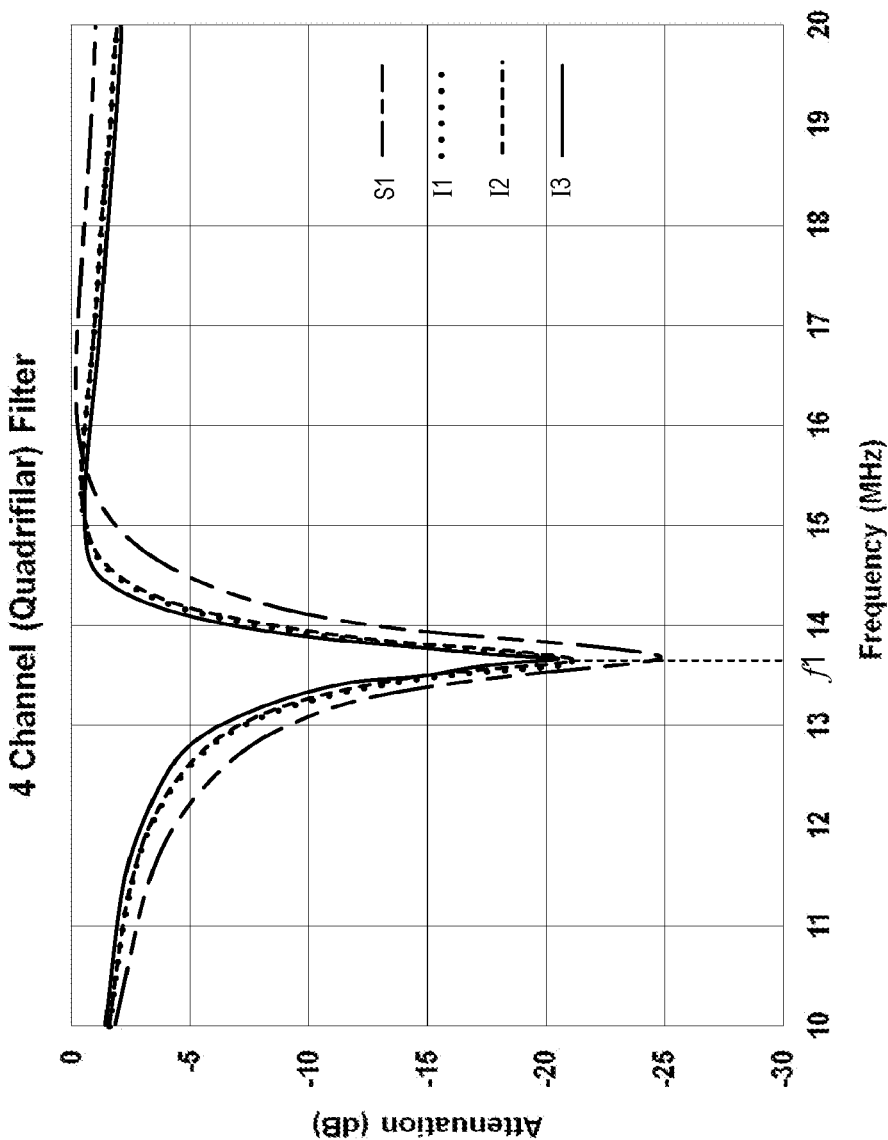
FIG. 8B
FIG. 8A

MUTUALLY INDUCED FILTERS

CLAIM OF PRIORITY

This application is a continuation of and claims priority, under 35 U.S.C. § 120, to U.S. patent application Ser. No. 16/036,491, filed on Jul. 16, 2018, and titled "Mutually Induced Filters," which is a continuation of and claims priority, under 35 U.S.C. § 120, to U.S. patent application Ser. No. 14/884,401, filed on Oct. 15, 2015, titled "Mutually Induced Filters", and issued as U.S. Pat. No. 10,044,338, all of which are incorporated herein by reference in their entirety for all purposes.

FIELD

The present embodiments relate to mutually induced filters used in a plasma processing system.

BACKGROUND

Generally, process reactors are used to process operations upon wafers, e.g., silicon wafers. These wafers are typically processed numerous times in various reactors in order to form integrated circuits thereon. Some of these process operations involve, for instance, depositing materials over select surfaces or layers of a wafer. One such reactor is a plasma enhanced chemical vapor deposition (PECVD) reactor.

For example, a PECVD reactor may be used to deposit insulation films such as silicon oxide (SiO), silicon nitride (SiN), silicon carbide (SiC), silicon oxide carbide (SiOC), and others. Conductor films may also be deposited using PECVD reactors. Such material films, to name a few examples, may include tungsten silicide (WSi), titanium nitride (TiN), aluminum (Al) alloy, etc. Depending on the type of film being deposited, specific reaction gases are brought into the PECVD reactor while radio frequency (RF) power is supplied to produce a plasma that enables the deposition.

During the deposition process, systems and circuitry are used to set and/or monitor settings and operational parameters. One example parameter is temperature, e.g., which is controlled by heaters embedded in a substrate support of a reactor. In some cases, the circuitry used to set, control and/or monitor parameters can become complex and extensive. In addition, some systems require rotation of the wafer while processing, which further requires additional circuitry and control. Conventionally, as reactor systems become more complex, more circuitry is added to enable the settings, control and/or monitoring. Unfortunately, as reactor system increase in complexity, so does the size and cost of such systems.

It is in this context that embodiments described in the present disclosure arise.

SUMMARY

Embodiments of the disclosure provide apparatus, methods and computer programs for fabricating and using a mutually induced filter used in a plasma processing system. It should be appreciated that the present embodiments can be implemented in numerous ways, e.g., a process, an apparatus, a system, a device, or a method on a computer-readable medium. Several embodiments are described below.

In one embodiment, a mutually induced filter is provided. The mutually induced filter filters radio frequency (RF) power that may interfere with a signal, e.g., an alternating current (AC) signal, a direct current (DC) signal, etc., that is being supplied to a load or that is being received from a load. The interfering RF power is generated from RF power that is supplied from one or more RF generators to a pedestal within a plasma chamber. The mutually induced filter is fabricated by twisting one or more wires to form a combination of wires and then winding the combination into a plurality of turns to form multiple inductors. Moreover, a capacitor is connected to one of the inductors. A resonant frequency of a combination of the capacitor and the one of the inductors is transferred from the one of the inductors to remaining of the inductors of the mutually induced filter so that the mutually induced filter has the resonant frequency. Any signals passing through the mutually induced filter are filtered at the resonant frequency. In an embodiment, another capacitor is connected to another one of the inductors and another resonant frequency of a combination of the other capacitor and the other one of the inductors is transferred from the other one of the inductors to remaining inductors of the mutually induced filter to couple the other resonant frequency to the mutually induced filter. Any signals passing through the mutually induced filter are filtered at both the resonant frequencies.

In one embodiment, a mutually induced filter for filtering radio frequency (RF) power from signals supplied to a load is described. The mutually induced filter includes a first portion connected to a first load element of the load for filtering RF power from one of the signals supplied to the first load element. The load is associated with a pedestal of a plasma chamber. The mutually induced filter further includes a second portion connected to a second load element of the load for filtering RF power from another one of the signals supplied to the second load element. The first and second portions are twisted with each other to be mutually coupled with each other to further facilitate a coupling of a resonant frequency associated with the first portion to the second portion.

In an embodiment, a mutually induced filter for filtering RF power from signals received from a load is described. The mutually induced filter includes a first portion connected to a first load element of the load for filtering RF power from one of the signals received from the first load element. The mutually induced filter includes a second portion of the mutually induced filter connected to a second load element of the load for filtering RF power from another one of the signals received from the second load element. The first and second portions are twisted with each other to be mutually coupled with each other to further facilitate a coupling of a resonant frequency associated with the first portion to the second portion.

In one embodiment, a mutually induced filter for filtering RF power from signals associated with a plurality of loads is described. The mutually induced filter includes a first portion connected to a first load element of a first one of the loads for filtering RF power from one of the signals supplied to the first load element. The first load is associated with a pedestal of a plasma chamber. The mutually induced filter includes a second portion connected to a second load element of the first load for filtering RF power from another one of the signals supplied to the second load element. The mutually induced filter also includes a third portion connected to a first load element of a second one of the loads for filtering RF power from one of the signals received from the first load element of the second load. The second load is associated with the pedestal of the plasma chamber. The mutually induced filter includes a fourth portion of connected to a second load element of the second load for filtering RF power from another one of the signals received from the second load element of the second load. The first, second, third, and fourth portions are twisted and wound with each other to be mutually coupled with each other to further facilitate a coupling of a resonant frequency associated with the first portion to the second, third, and fourth portions and a resonant frequency associated with the fourth portion to the first, second, and third portions.

Some advantages of the embodiments described herein include arranging a first portion of a mutually induced filter and a second portion of the mutually induced filter to mutually couple the portions with each other. A current in the first portion creates an induced electromotive force in the second portion. The electromotive force generates a current within the second portion to mutually couple the first and second portions. Moreover, as a result of the mutual coupling, a resonant frequency associated with the first portion is coupled to the second portion to provide a uniformity in the resonant frequency across both the first and second portions for filtering RF power from a signal. The uniformity in the resonant frequency provides uniformity in processing a substrate, etc.

Also, as another advantage, a current in the second portion creates an induced electromotive force in the first portion. The induced electromotive force generates a current passing through the first portion to mutually couple the second portion to the first portion. Moreover, as a result of the mutual coupling, a resonant frequency associated with the second portion is coupled to the first portion to provide a uniform resonant frequency across both first and second portions for filtering RF power from the a signal passing through the first portion provide uniformity in processing a substrate.

Moreover, a high amount of mutual coupling in the first and second portions results in a high level of mutual inductance, and the high level of mutual inductance results in achieving improved common mode rejection.

Further advantages of the embodiments described herein include that one channel to which a capacitor is coupled is tuned for each frequency band. Mutual coupling between inductors of the mutually induced filter facilitates a coupling of the tuned frequency of the mutually induced filter to other channels of the mutually induced filter. This saves labor time and costs associated with tuning multiple capacitors of previously used filters, which are further described below.

Additional advantages of the embodiments described herein include using a lower number of filters to filter RF power from signals associated with heaters, thermocouples, and a motor. Previously, for example, each channel of a filter included two filters, one for filtering RF power from at a high frequency and one for filtering RF power from at a low frequency. The two filters were coupled in series. For two heater elements or two thermocouples or a motor, 8 such filters were used. For two heater elements, two thermocouples, and one motor, 24 such filters were used. The use of 24 filters increases sizes of filter boxes in which the 24 filters are fitted. In case of four stations, 96 such filters were used. Comparatively, the embodiments described herein use three mutually induced filters per station, one for two heater elements, one for two thermocouples, and one for a motor. Each mutually induced filter has one or two resonant frequencies. In case of four stations, 12 mutually induced filters are used, instead of 96 filters used previously. The lower number of mutually induced filters reduces time, cost, and space associated with the 96 filters. For example, each mutually induced filter is fitted into a smaller size package compared to the 8 previously used filters. As another example, it takes less time to assemble a mutually induced filter than taken to assemble the 8 previously used filters. The 8 previously used filters include 8 capacitors and 8 inductors, which are greater than 2 capacitors and 6 inductors used in the mutually induced filter. The higher number of capacitors and inductors in the previously used filters increases an amount of time to assemble the previously used filters compared to time taken to assemble the mutually induced filter.

Also, mutual inductance results in a coupling of a resonant frequency across the mutually induced filter, and the uniform resonant frequency increases chances of channel-to-channel matching, station-to-station matching, and tool-to-tool matching.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 4A is a diagram of a plasma processing system to illustrate use of mutually induced filters with various components of the plasma processing system, in accordance with some embodiments described in the present disclosure.

FIG. 4B is a circuit diagram of any one of the mutually induced filters of FIG. 4A, in accordance with various embodiments described in the present disclosure.

FIG. 4C is a diagram of any one of the mutually induced filters of FIG. 4A in which the six wires are twisted and wound together to form six inductors, in accordance with several embodiments described in the present disclosure.

FIG. 8A is a graph to illustrate that resonant frequencies of mutually coupled portions of a mutually induced filter are the same or substantially the same, in accordance with several embodiments described in the present disclosure.

FIG. 8B is a circuit diagram of the mutually induced filter of FIG. 8A, in accordance with several embodiments described in the present disclosure.

FIG. 10B-1 illustrates a prototype of a dual frequency mutually induced filter that includes the components of FIG. 10A, in accordance with various embodiments described in the present disclosure.

FIG. 10B-2 is a circuit diagram of the dual band mutually induced filter of FIG. 10A, in accordance with various embodiments described in the present disclosure.

DETAILED DESCRIPTION

Figure 1:
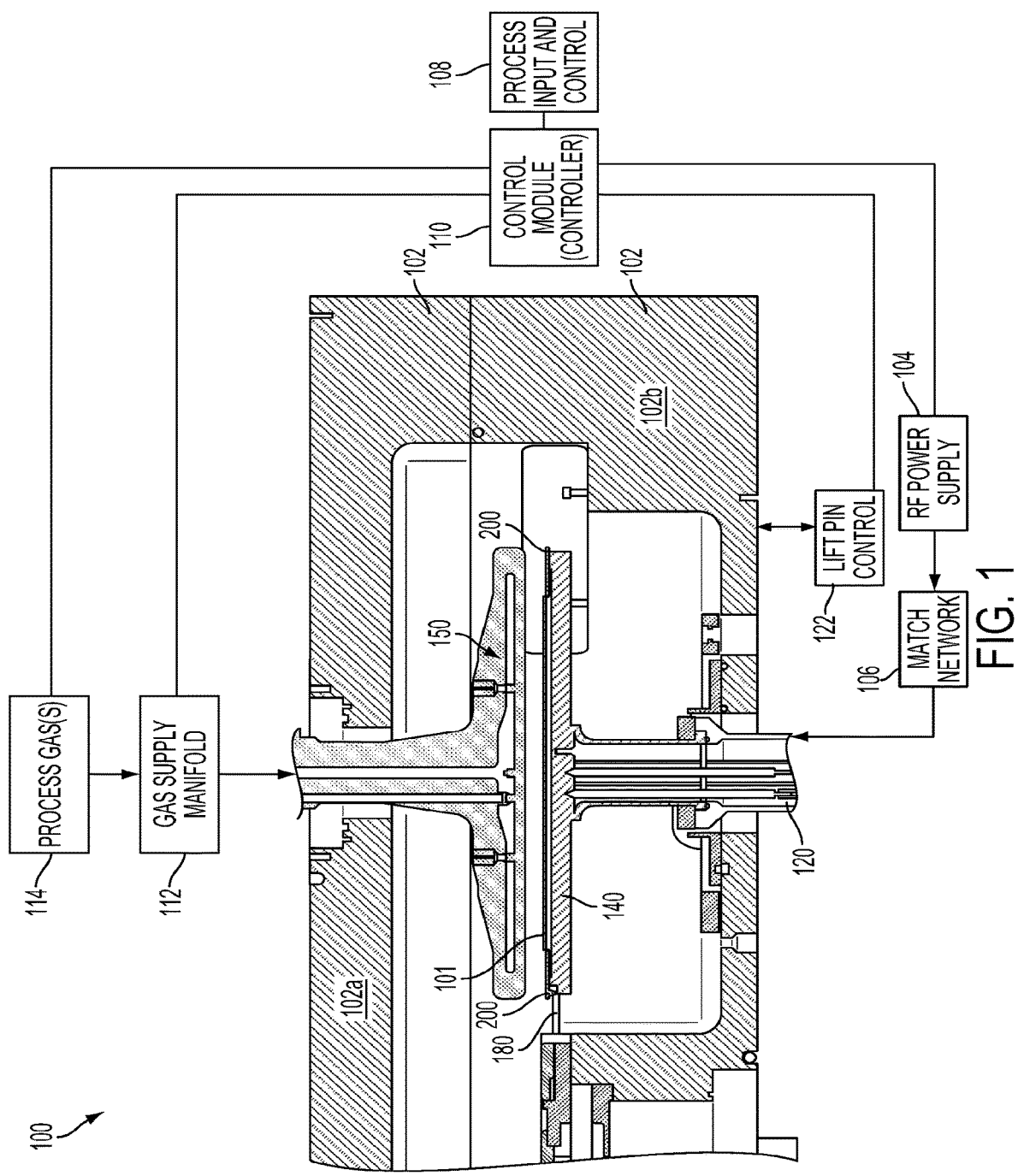
FIG. 1 illustrates a substrate processing system, which is used to process a wafer, in accordance with some embodiments described in the present disclosure.

The following embodiments describe systems and methods for fabricating and using a mutually induced filter to achieve one or more resonant frequencies. It will be apparent that the present embodiments may be practiced without some or all of these specific details. In other instances, well known process operations have not been described in detail in order not to unnecessarily obscure the present embodiments.

Deposition of films is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, e.g., a wafer chuck, etc., and/or other wafer holding apparatus. For certain operations, the apparatus may include a heater such as a heating plate to heat the wafer, a set of thermocouples to measure temperature during processing the wafer, and a motor to rotate the pedestal during the processing of the wafer.

A mutually induced filter is used to filter radio frequency (RF) power from a signal, e.g., a direct current (DC) signal, an alternating current (AC) signal, etc., that is being supplied to or received from a load. Examples of the load include the heater, the thermocouples, and the motor. The mutually induced filter is fabricated to achieve mutual inductance or mutual coupling between a first portion of the mutually induced filter and a second portion of the mutually induced filter. The phenomena of mutually induced filtering is not one associated with a transformer. For example, in a transformer, a mutual inductance is generated in a secondary coil of the transformer when a current is applied to a primary coil of the transformer. The current is applied to the primary coil when an active AC source, e.g., a voltage AC source, etc., is connected to the primary coil. A change in the current in the primary coil produces an electromotive force, e.g., a voltage, etc., in the secondary coil. Comparatively, in the mutually induced filter, described in detail further below, use of passive components, e.g., inductors, capacitors, etc., within the first portion of the mutually induced filter results in a transfer of one or more resonant frequencies from the first portion to the second portion. A transfer of a signal between the passive components within the first portion of the mutually induced filter creates an electromagnetic field. The electromagnetic field induces an electromotive force within the second portion of the mutually induced filter to mutually couple inductive components of the first and second portions. There is no direct signal being applied to the first portion such as from an AC power source, etc. The mutual coupling between the inductive components of the mutually induced filter facilitates achieving a resonant frequency associated with a combination of a capacitive component and an inductive component of the first portion of the filter so that the mutually induced filter has the resonant frequency.

In one embodiment in which a capacitive component is used within the second portion of a mutually induced filter in addition to the capacitive component within the first portion, mutual coupling between the first and second portions of the mutually induced filter facilitates achieving resonant frequencies associated with combinations of capacitive component and inductive components of the mutually induced filter.

FIG. 1 illustrates a substrate processing system 100, which is used to process a wafer 101. The system includes a chamber 102 having a lower chamber portion 102b and an upper chamber portion 102a. A center column is configured to support a pedestal 140, which in one embodiment is a powered electrode. The pedestal 140 is electrically coupled to a radio frequency (RF) power supply 104 via a match network 106. The power supply is controlled by a control module 110, e.g., a controller, etc., which is further described below. The control module 110 operates the substrate processing system 100 by executing process input and control 108. The process input and control 108 may include process recipes, such as power levels, timing parameters, process gasses, mechanical movement of the wafer 101, etc., so as to deposit or form films over the wafer 101.

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into a shower head 150 and distributed in a space volume defined between the showerhead 150 face that faces that wafer 101 and the wafer 101 resting over the pedestal 140.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system.

In an embodiment, an upper electrode within the showerhead 150 is grounded when RF power is supplied from the RF power supply 104 to a lower electrode within the pedestal 140.

In one embodiment, instead of the pedestal 140 being electrically coupled to the RF power supply 104 via the match network 106, an electrode within the showerhead 150 is coupled to the RF power supply 104 via a match network for receiving power from the RF power supply 104 and the lower electrode within the pedestal 140 is grounded.

In one embodiment, instead of the RF power supply 104, multiple RF power supplies generating RF signals having different frequencies are used, e.g., a power supply for generating an RF signal having a frequency RF1 and a power supply for generating an RF signal having a frequency RF2.

Figure 2:
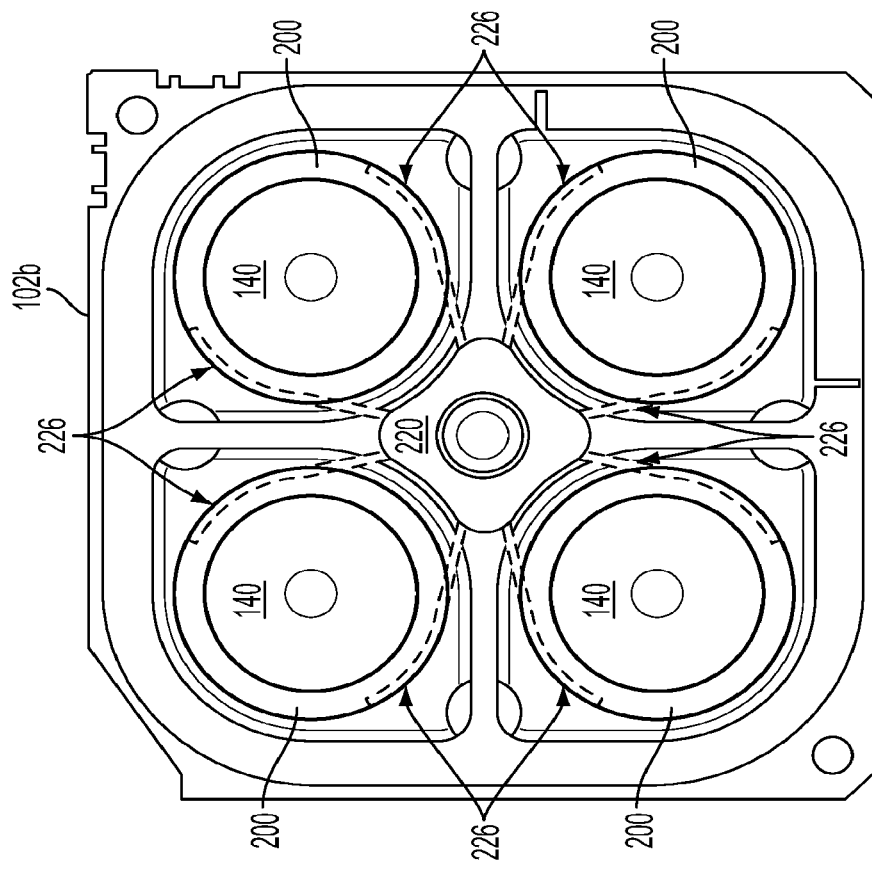
FIG. 2 illustrates a top view of a multi-station processing tool, where four processing stations are provided, in accordance with various embodiments described in the present disclosure.

FIG. 2 illustrates a top view of a multi-station processing tool, where four processing stations are provided. This top view is of the lower chamber portion 102b (e.g., with the top chamber portion 102a removed for illustration), where four stations are accessed by spider forks 226. In one embodiment, there is no isolation wall or other mechanism to isolate one station from another. Each spider fork, or fork includes a first and second arm, each of which is positioned around a portion of each side of the pedestal 140. In this view, the spider forks 226 are drawn in dash-lines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

Figure 3:
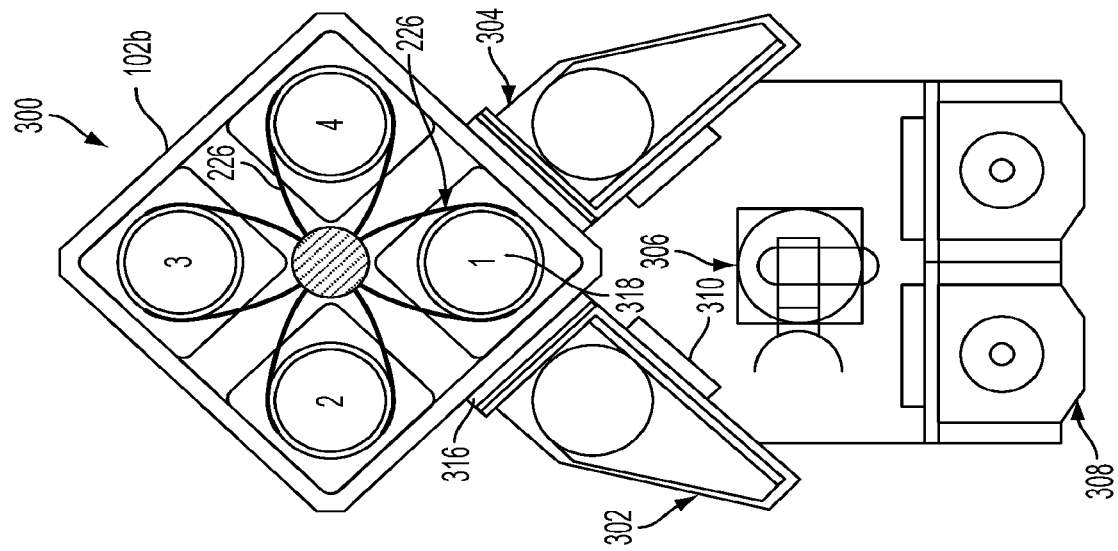
FIG. 3 shows a schematic view of a multi-station processing tool with an inbound load lock and an outbound load lock, in accordance with various embodiments described in the present disclosure.

FIG. 3 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 102b. Thus, when chamber transport 316 is opened, another robot (not shown) may move the substrate from inbound load lock 302 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 318 for station 1) and process gas delivery line inlets.

FIG. 3 also depicts spider forks 226 for transferring substrates within the processing chamber 102b, which is sometimes referred to herein as a tool. As will be described in more detail below, the spider forks 226 rotate and enable transfer of wafers from one station to another. The transfer occurs by enabling the spider forks 226 to lift carrier rings 200 from an outer undersurface, which lifts the wafer, and rotates the wafer and carrier together to the next station. In one configuration, the spider forks 226 are made from a ceramic material to withstand high levels of heat during processing.

FIG. 4A is a diagram of an embodiment of a plasma processing system 400 to illustrate use of mutually induced filters with various components of the plasma processing system 400. The plasma processing system 400 includes a pedestal 402, such as, for example, the pedestal 140 (FIG. 1). The pedestal 402 includes a heater element HE1 and a heater element HE2 for controlling temperature in different zones within a gap between the showerhead 150 (FIG. 1) and the pedestal 140 (FIG. 1). Examples of a heater element include a resistor and a plate. The heater element HE1 is operated to heat a portion of a component, e.g., an electrode, etc., located within the pedestal 402 to control temperature of processing the wafer 101 (FIG. 1). The heater element HE2 is operated to heat another portion of the component located within the pedestal 402. For example, the component is located in contact with the heater elements HE1 and HE2 to be heated by the heater elements HE1 and HE2.

A thermocouple TC1 is in contact with the heater element HE1 to sense a temperature of the heater element HE1 and a thermocouple TC2 is in contact with the heater elements HE2 to sense a temperature of the heater element HE2. Moreover, a motor is connected via one or more connection mechanisms, e.g., gears, shafts, links, etc., to the pedestal 402 to rotate the pedestal 402 about a vertical axis z.

The plasma processing system 400 further includes a mutually induced filter 404A that are connected to the heater elements HE1 and HE2 and to AC power supplies AC1 and AC2, a mutually induced filter 404B that is connected to the thermocouples TC1 and TC2 and to a temperature controller, and a mutually induced filter 404C that is connected to the motor and to power supply.

It should be noted that a controller, as used herein, includes a processor and a memory device. Examples of the processor include a microprocessor, an application specific integrated circuit (ASIC), a programmable logic device (PLD), and a central processing unit (CPU). Examples of the memory device include a read-only memory (ROM), a random access memory (RAM), a flash memory, a storage disk array, a hard disk, etc.

The AC power supply AC1 supplies an AC signal to a first portion of the mutually induced filter 404A, and the first portion filters RF power from the AC signal to output a filtered signal. The filtered signal is sent from the first portion of the mutually induced filter 404A to the heater element HE1 to heat the heater element HE1. Similarly, the AC power supply AC2 supplies an AC signal to a second portion of the mutually induced filter 404A and the second portion filters RF power from the AC signal to output a filtered signal, which is sent from the second portion of the mutually induced filter 404A to the heater element HE2 to heat the heater element HE2. It should be noted that RF power that is filtered from the AC signals supplied by the AC power supplies AC1 and AC2 is coupled to the AC signals from RF power that is being supplied to the pedestal from the RF power supply 104. Such filtering reduces chances that RF power is coupled to a ground potential of the AC power supplies AC1 and AC2. Furthermore, such filtering increases chances of RF power being supplied to the pedestal instead of being grounded via the AC power supplies AC1 and AC2.

The thermocouple TC1 senses temperature of the heater element HE1 and to generate a sensed temperature signal, which is provided to a first portion of the mutually induced filter 404B for filtering RF power from the sensed temperature signal. RF power from the sensed temperature signal that passes through the first portion is filtered by the mutually induced filter 404B to provide a filtered signal to the temperature controller. Similarly, the thermocouple TC2 senses temperature of the heater element HE2 and to generate a sensed temperature signal, which passes via a second portion of the mutually induced filter 404B for filtering RF power from the sensed temperature signal. RF power from the sensed temperature signal that passes through the second portion of the mutually induced filter 404B is filtered by the mutually induced filter 404B to provide a filtered signal to the temperature controller. It should be noted that RF power that is filtered from the sensed temperature signals generated by the thermocouples TC1 and TC2 is coupled with the sensed temperature signals from RF power that is being supplied to the pedestal from the RF power supply 104. Such filtering reduces a probability that the RF power that is coupled to the sensed temperature signals will be supplied to the temperature controller and damage the temperature controller. Furthermore, such filtering increases chances of RF power being supplied to the pedestal instead of being transferred to the temperature controller.

The temperature controller includes a multimeter that receives the filtered signal from the first portion of the mutually induced filter 404B and provides a sensed value of the temperature of the heater element HE1 to the processor of the temperature controller. The processor of the temperature controller determines whether to change, e.g., increase, decrease, etc., the temperature of the heater element HE1 based on the sensed value. Upon determining that the temperature is to be changed, the temperature controller sends a signal indicating the change in the temperature to the AC power supply AC1. Upon receiving the signal for changing the temperature, the AC power supply AC1 generates an AC signal for changing the temperature of the heater element HE1 and sends the AC signal via the first portion of the mutually induced filter 404A to the heater element HE1.

Moreover, in a similar manner, the multimeter receives the filtered signal from the second portion of the mutually induced filter 404B and provides a sensed value of the temperature of the heater element HE2 to the processor of the temperature controller. The processor of the temperature controller determines whether to change the temperature of the heater element HE2 based on the sensed value. Upon determining that the temperature is to be changed, the temperature controller sends a signal indicating the change in the temperature to the AC power supply AC2. Upon receiving the signal for changing the temperature, the AC power supply AC2 generates an AC signal for changing the temperature of the heater element HE2 and sends the AC signal via the second portion of the mutually induced filter 404A to the heater element HE2.

The AC power source supplies AC power signals to the mutually induced filter 404C. The mutually induced filter 404C filters RF power from the AC power signals to generate filtered signals, which are sent from the mutually induced filter 404C to the motor. A rotor of the motor rotates with respect to a stator of the motor when the stator receives the filtered signals. The rotational movement of the rotor is transferred to the pedestal 402 via the one or more connection mechanisms. It should be noted that RF power that is filtered from the AC power signals generated by the AC power source is coupled with the AC power signals from RF power that is being supplied to the pedestal from the RF power supply 104. Such filtering reduces chances that the RF power that is coupled to the AC power signals will be supplied to the motor and cause damage to the motor. Furthermore, such filtering increase chances of RF power being supplied to the pedestal instead of being transferred to the motor.

In an embodiment, any number of heater elements are used in the pedestal 402 to heat the component within the pedestal 402, and any number of thermocouples are used to sense temperature of the heater elements.

In one embodiment, instead of the AC signal being supplied to the heater element HE1 from the AC power supply AC1 and the AC signal being supplied to the heater elements HE2 from the AC power supply AC2, a DC power signal is supplied to the heater element HE1 from a DC power supply and a DC power signal is supplied to the heater element HE2 from a DC power supply, and the DC power signals are filtered by a mutually induced filter, embodiments of which are described herein.

In an embodiment, instead of AC power signals being supplied to the motor from the AC power source, DC power signals are supplied to the motor from a DC power source and RF power is filtered from the DC power signals by using a mutually induced filter, embodiments of which are described herein.

In one embodiment, instead of or in addition to the thermocouples TC1 and TC2, two additional thermocouples are used for over temperature protection, e.g., in case temperatures of the heater elements HE1 and HE2 exceed a pre-determined temperature, etc. The two additional thermocouples are connected to a mutually induced filter in a manner similar to that of connecting the mutually induced filter 404B to the thermocouples TC1 and TC2.

FIG. 4B is a circuit diagram of a mutually induced filter 410, which is an example of any of the mutually induced filters 404A, 404B, and 404C (FIG. 4A). The mutually induced filter 410 includes a portion 410A and a portion 410B.

The portion 410A includes a capacitor connected in series to an inductor and further includes two additional inductors, which are twisted and wound with the inductor coupled in series to the capacitor. In an embodiment, a mutually induced filter includes any other number of inductors, e.g., one, three, etc., which are twisted and wound with the inductor coupled in series to the capacitor of the portion 410A. Moreover, in an embodiment, a mutually induced filter includes two or more capacitors coupled in series with each other or in parallel with each other instead of one capacitor shown in FIG. 4B. Similarly, the portion 410B includes a capacitor connected in series to an inductor and further includes two additional inductors, which are twisted and wound with the inductor coupled in series to the capacitor of the portion 410B.

It should be noted that a resonant frequency f1 of a series combination of the capacitor and the inductor of the portion 410A is the same as that of a resonant frequency f2 of a series combination of the capacitor and the inductor of the portion 410B. In one embodiment, the resonant frequency f1 of the series combination of the capacitor and the inductor of the portion 410A is different from the resonant frequency f2 of the series combination of the capacitor and the inductor of the portion 410B. For example, the frequency f1 is a high frequency (HF) and the frequency f2 is a low frequency (LF). As another example, the frequency f1 is a low frequency and the frequency f2 is a high frequency. As yet another example, the frequency f1 is a low or a high frequency and the frequency f2 is between the high and low frequencies. As another example, the frequency f2 is a low or a high frequency and the frequency f1 is between the high and low frequencies. As another example, the frequency f1 ranges between ±10% from 400 kilohertz (kHz), which is an example of a low frequency, and the frequency f2 ranges between ±5% from 13.56 megahertz (MHz), which is an example of a high frequency.

Wires of the mutually induced filter 410 are twisted together to form one unitary body and then wound to form inductors, which is also one unitary body. For example, six wires are rotated around another wire and the wires are then wound to form a unitary body having six inductors that are mutually coupled with each other. The resonant frequency f1 is transformed from the series combination of the capacitor and the inductor of the portion 410A to the remaining inductors of the mutually induced filter 410. Similarly, the resonant frequency f2 of the series combination of the capacitor and the inductor of the portion 410B is transformed from the series combination to the remaining inductors of the mutually induced filter 410.

It should be noted that a block 411 around the inductors of the mutually induced filter 410 that are not directly connected to the capacitors of the mutually induced filter 410 is shown to illustrate mutual inductance between the inductors.

As used herein, in one embodiment, twisting is to rotate two or more wires around each other, e.g., to form a strand, to form a braid-shaped structure, etc., and wound is to form multiple turns, e.g., create a spiral, etc., of a coil.

In one embodiment, the capacitor and the inductor of the portion 410B are excluded from the portion 410B. In an embodiment, the capacitor and the inductor of the portion 410A are excluded from the portion 410A.

FIG. 4C is a diagram of an embodiment of the mutually induced filter 410 in which the six wires are twisted and then wound together to form six inductors. Two of the inductors are coupled with the capacitors of the mutually induced filter 410 to form the mutually induced filter 410.

Figure 5A:
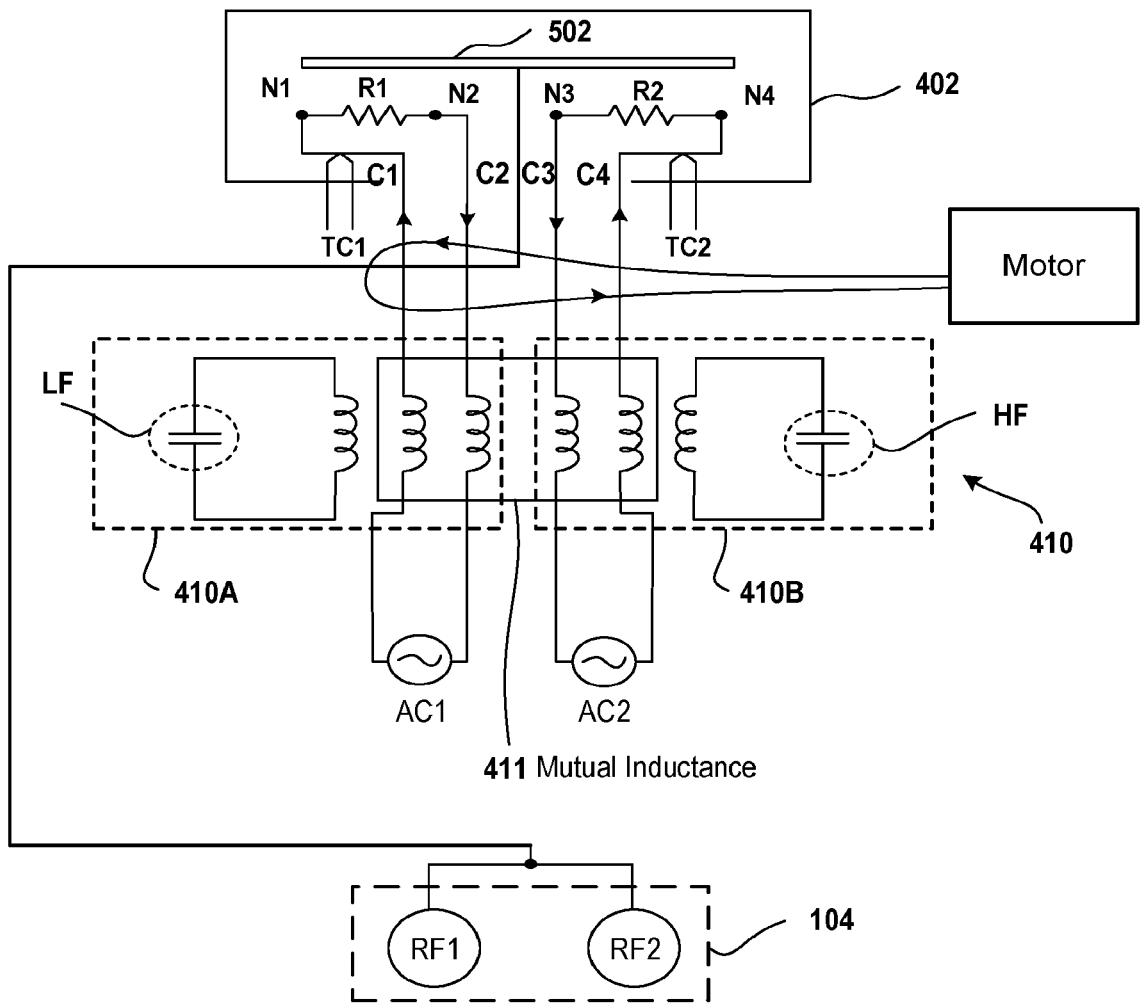
FIG. 5A is a diagram a mutually induced filter coupled to heater resistors of the substrate processing system of FIG. 1, in accordance with some embodiments described in the present disclosure.

FIG. 5A is a diagram of an embodiment of the mutually induced filter 410 coupled to resistors R1 and R2. The resistor R1 is an example of the heater element HE1 (FIG. 4A) and the resistor R2 is an example of the heater element HE2 (FIG. 4A). A node N1 of the resistor R1 is connected to a channel C1 of the portion 410A, a node N2 of the resistor R1 is connected to another channel C2 of the portion 410A, a node N3 of the resistor R2 is connected to a channel C3 of the portion 410B, and a node N4 of the resistor R2 is connected to a channel C4 of the portion 410B. The resistor R1 is used to heat a left portion of a lower electrode 502 of the pedestal 402 and the resistor R2 is used to heat a right portion of the lower electrode 502.

A current signal supplied by the AC power supply AC1 is sent to an inductor of the channel C1. RF power is filtered by the mutually induced filter 410 at the resonant frequency f1 from the current signal that is supplied by the AC power supply AC1 to the resistor R1. The resonant frequency f1 is coupled to the channel C1 from the inductor coupled in series with the capacitor of the portion 410A to the inductor of the channel C1. Moreover, RF power is filtered at the resonant frequency f1 from a current signal that is returned from the resistor R1 via the channel C2. The resonant frequency f1 is coupled to the channel C2 from the inductor coupled in series with the capacitor of the portion 410A via the inductor of the channel C1 to the inductor of the channel C2. Also, RF power is filtered at the resonant frequency f2 from the current signal supplied by the AC power supply AC1 to the resistor R1. The resonant frequency f2 is coupled to the channel C1 from the inductor coupled in series with the capacitor of the portion 410B via the inductor of the channel C4, the inductor of the channel C3, and the inductor of the channel C2, to the inductor of the channel C1. Furthermore, RF power is filtered at the resonant frequency f2 from a current signal that is returned from the resistor R1 via the channel C2. The resonant frequency f2 is coupled to the channel C2 from the inductor coupled in series with the capacitor of the portion 410B via the inductor of the channel C4 and the inductor of the channel C3 to the inductor of the channel C2.

A current signal supplied by the AC power supply AC2 is sent to an inductor of the channel C4. RF power is filtered by the mutually induced filter 410 at the resonant frequency f1 from the current signal that is supplied by the AC power supply AC2 to the resistor R2. The resonant frequency f1 is coupled to the channel C4 from the inductor coupled in series with the capacitor of the portion 410A via the inductor of the channel C1, the inductor of the channel C2, and the inductor of the channel C3 to the inductor of the channel C4. Moreover, RF power is filtered at the resonant frequency f1 from a current signal that is returned from the resistor R2 via the channel C3. The resonant frequency f1 is coupled to the channel C3 from the inductor coupled in series with the capacitor of the portion 410A via the inductor of the channel C1 and the inductor of the channel C2 to the inductor of the channel C3. Also, RF power is filtered at the resonant frequency f2 from the current signal supplied by the AC power supply AC2 to the resistor R2. The resonant frequency f2 is coupled to the channel C4 from the inductor coupled in series with the capacitor of the portion 410B to the inductor of the channel C4. Furthermore, RF power is filtered at the resonant frequency f2 from a current signal that is returned from the resistor R2 via the channel C3. The resonant frequency f2 is coupled to the channel C3 from the inductor coupled in series with the capacitor of the portion 410B via the inductor of the channel C4 to the inductor of the channel C3.

Figure 5B:
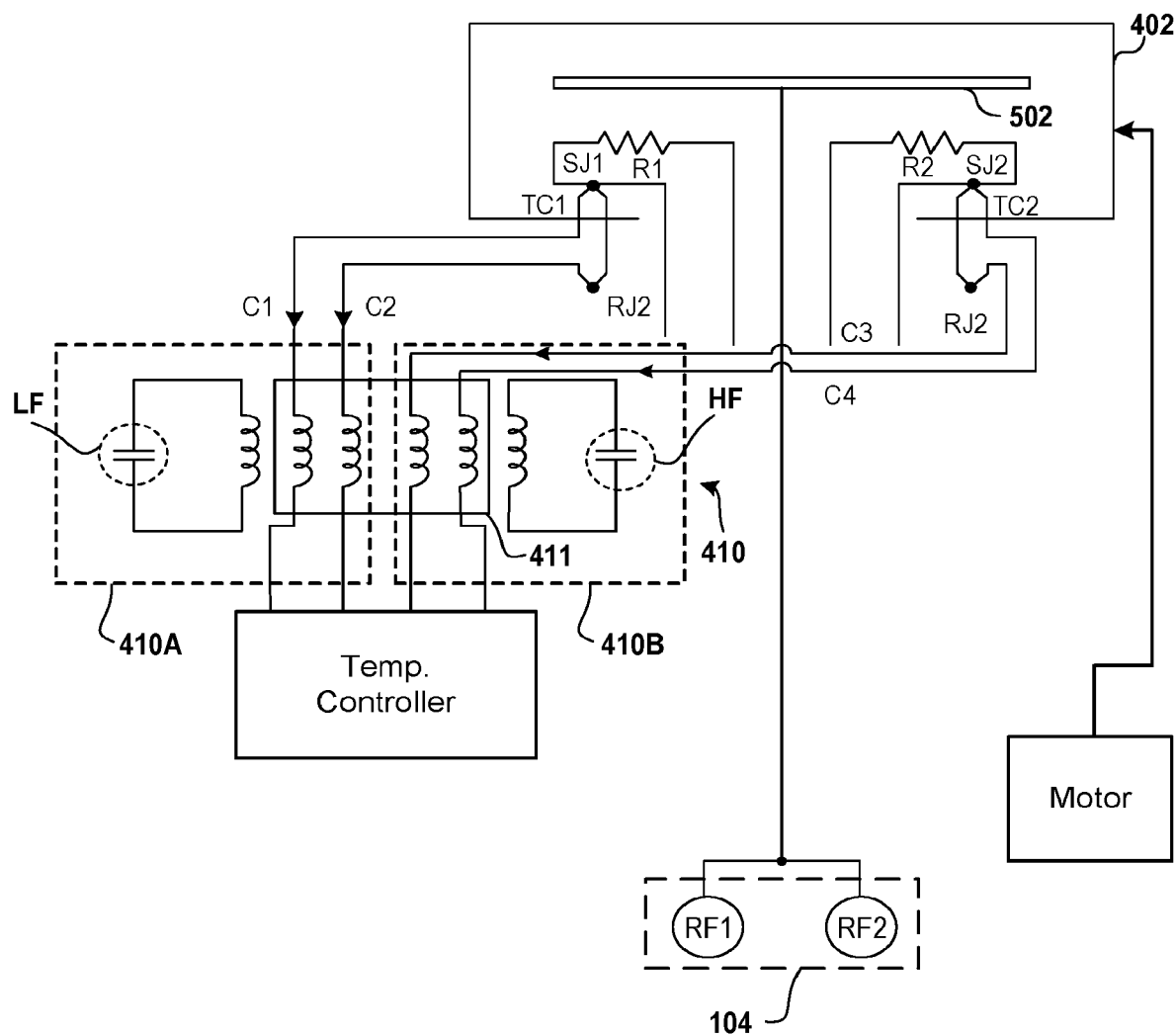
FIG. 5B is a diagram of a mutually induced filter coupled to thermocouples used within the substrate processing system of FIG. 1, in accordance with some embodiments described in the present disclosure.

FIG. 5B is a diagram of an embodiment of the mutually induced filter 410 coupled to the thermocouples TC1 and TC2. A sensed temperature signal is sent from a sensing junction SJ1 of the thermocouple TC1 via a portion of the channel C1 of the portion 410A to the inductor of the channel C1. Moreover, a reference temperature signal is sent from a reference junction RJ1 of the thermocouple TC1 via a portion of the channel C2 of the portion 410A to the inductor of the channel C2.

The resonant frequency f1 of the series combination of the capacitor and the inductor of the portion 410A is coupled from the inductor of the channel C1 via the inductor of the channel C2 and the inductor of the channel C3 to the inductor of the channel C4. Similarly, the resonant frequency f2 of the series combination of the capacitor and the inductor of the portion 410B is coupled from the inductor of the channel C4 via the inductor of the channel C3 and the inductor of a channel C2 to the inductor of the channel C1. RF power from the reference temperature signal sent from the reference junction RJ1 and from the sensed temperature signal sent from the sensing junction SJ1 is filtered by the portion 410A at the resonant frequencies f1 and f2 to generate filtered signals, which are used by the temperature controller to determine, e.g., measure, etc., a temperature of the resistor R1.

Similarly, a sensed temperature signal is sent from a sensing junction SJ2 of the thermocouple TC2 via the channel C4 of the portion 410B to the inductor of the channel C4. Moreover, a reference temperature signal is sent from a reference junction RJ2 of the thermocouple TC2 via the channel C3 of the portion 410B to the inductor of the channel C3. RF power from the reference temperature signal sent from the reference junction RJ2 and from the sensed temperature signal sent from the sensing junction SJ2 is filtered by the portion 410B at the resonant frequencies f1 and f2 to generate filtered signals, which are used by the temperature controller to determine a temperature of the resistor R2.

Figure 5C:
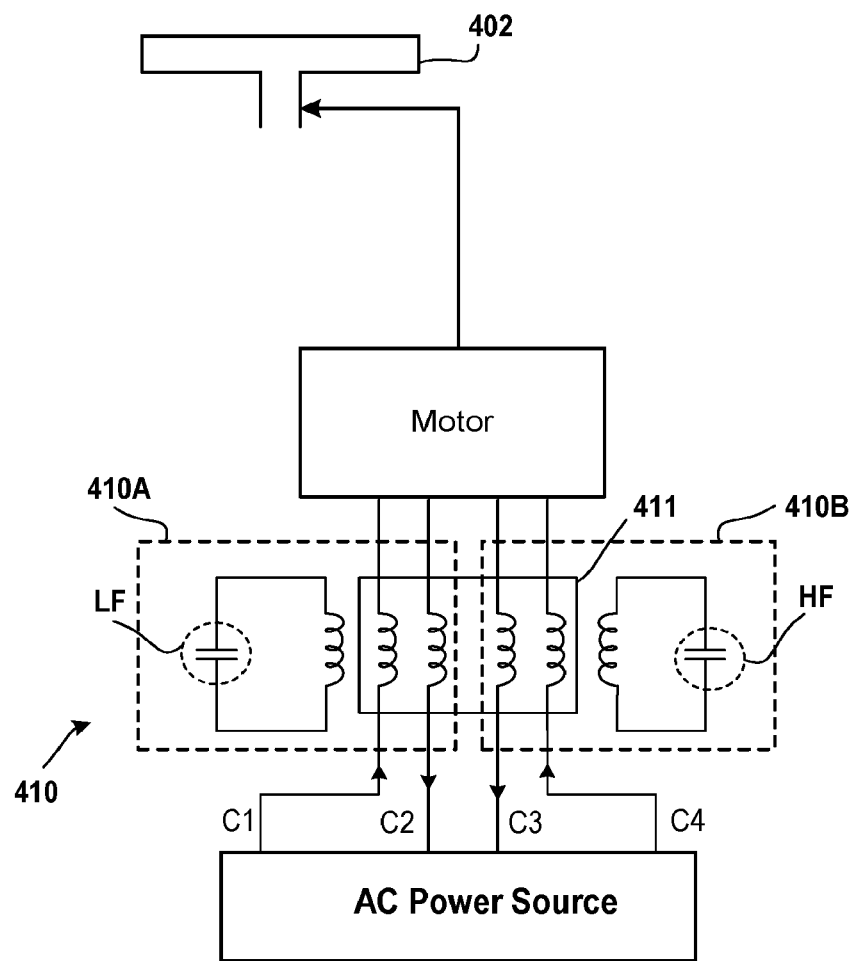
FIG. 5C is a diagram of a mutually induced filter coupled to a motor and a power supply, in accordance with various embodiments described in the present disclosure.

FIG. 5C is a diagram of an embodiment of the mutually induced filter 410 coupled to the motor and the AC power source. It should be noted that a first phase of an AC signal is supplied from the AC power source via the channel C1 of the portion 410A to a winding of stator of the motor and a first phase of an AC signal is returned from the winding to the AC power source via the channel C2 of the portion 410A. Moreover, a second phase of the supplied AC signal is provided from the AC power source via the channel C4 of the portion 410B to another winding of the stator of the motor and a second phase of the returned AC signal is sent from the other winding to the AC power source via the channel C3 of the portion 410B.

The resonant frequency f1 of the series combination of the capacitor and the inductor of the portion 410A is coupled from the inductor of the portion 410A via the inductor of the channel C1, the inductor of the channel C2, and the inductor of the channel C3 to the inductor of the channel C4. Similarly, the resonant frequency f2 of the series combination of the capacitor and the inductor of the portion 410B is coupled from the inductor or the portion 410B via the inductor of the channel C4, the inductor of the channel C3, and the inductor of the channel C2 to the inductor of the channel C1.

When the resonant frequency f1 is coupled with the portion 410B from the portion 410A, RF power from the first and second phases of the supplied AC signals and from the first and second phases of the returned AC signals is filtered by the mutually induced filter 410 at the resonant frequency f1. Moreover, when the resonant frequency f2 is coupled with the portion 410A from the portion 410B, RF power from the first and second phases of the supplied AC signals and from the first and second phases of the returned AC signals is filtered by the mutually induced filter 410 at the resonant frequency f2.

The above embodiment of the mutually induced filter 410 is associated with providing a two-phase AC signal to the motor. In one embodiment in which a three-phase AC signal is supplied by the AC power source to the motor, a third phase of the supplied AC signal is provided from the AC power source via a channel (not shown) of a mutually induced filter (not shown) to a winding of the stator of the motor and a third phase of the returned AC signal is returned from the winding of the stator to the AC power source via a channel of the mutually induced filter. Inductors of the mutually induced filter used to filter RF power from the third phase of the AC signal are mutually coupled with the inductors that are used to filter RF power from the first and second phases of the AC signal and the mutually coupling facilitates filtering of RF power from the third phase by the mutually induced filter at the resonant frequencies f1 and f2. Moreover, in case a series combination, of a capacitor and an inductor, having a resonant frequency f3 is coupled to an inductor of the mutually induced filter used to filter RF power from the third phase, there is mutual coupling between the portions 410A and 410B, and a portion that includes the capacitor and the inductors associated with filtering RF power from the third phase. The mutual coupling between the portion 410A, the portion 410B, and the portion facilitates filtering of RF power by the portions 410A and 410B and the portion at the resonant frequency f3.

Figure 5D:
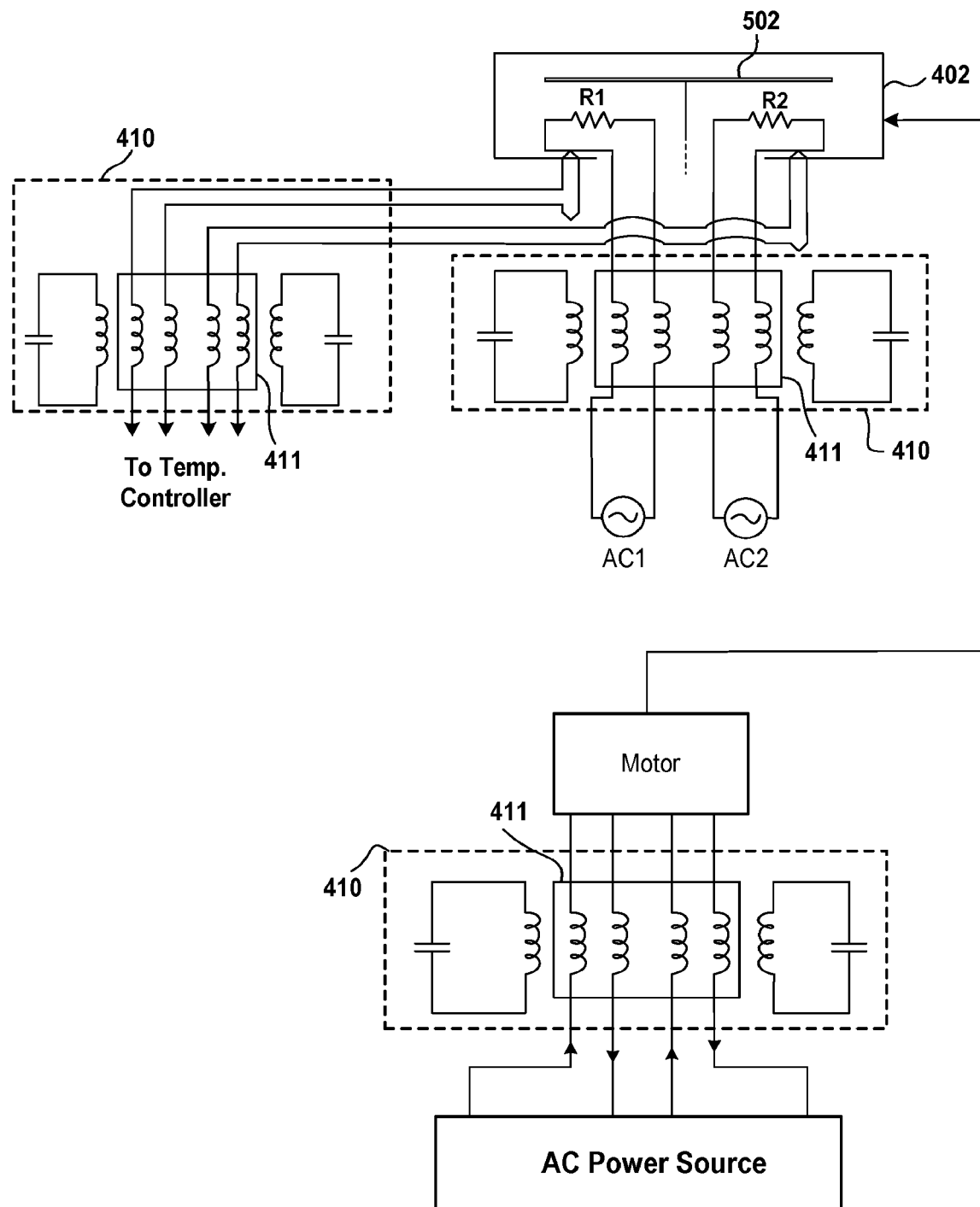
FIG. 5D shows a circuit diagram of the mutually induced filter coupled to the resistors, a circuit diagram of the mutually induced filter coupled to the thermocouples, and a circuit diagram of the mutually induced filter coupled to the motor, in accordance with several embodiments described in the present disclosure.

FIG. 5D is a diagram of an embodiment of the mutually induced filter 410 coupled to the resistors R1 and R2, the mutually induced filter 410 coupled to the thermocouples TC1 and TC1, and the mutually induced filter 410 coupled to the motor.

Figure 6:
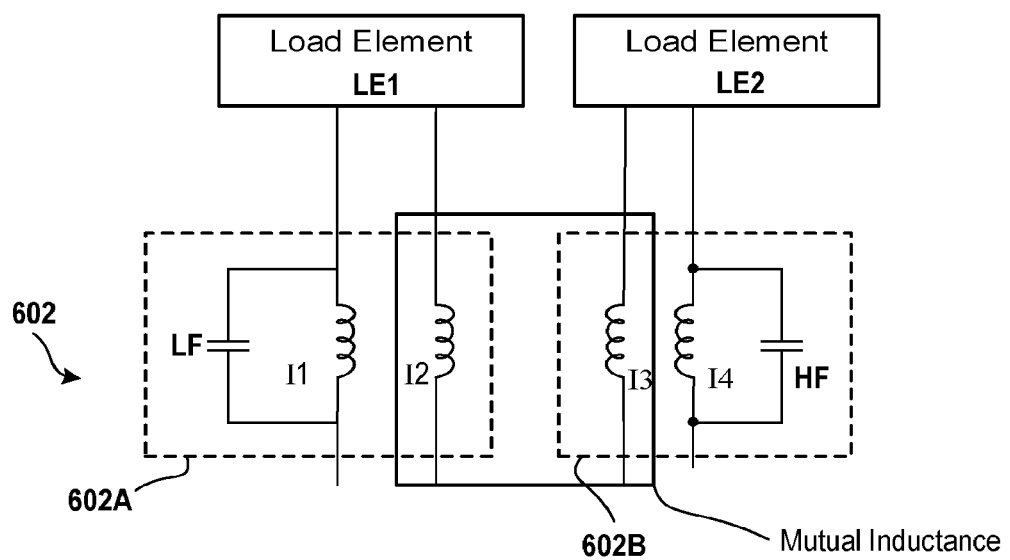
FIG. 6 is a diagram of a filter, which includes a first portion and a second portion, to illustrate mutual coupling between the portions, in accordance with several embodiments described in the present disclosure.

FIG. 6 is a diagram of an embodiment of a mutually induced filter 602, which includes a portion 602A and a portion 602B, to illustrate mutual coupling between the portions 602A and 602B. The portion 602A is connected to a load element LE1, e.g., the heater element HE1, or a winding of a stator of a motor, the thermocouple TC1, etc., and the portion 602B is connected to a corresponding load element LE2, e.g., the heater element HE2, or another winding of the stator of the motor, or the thermocouple TC2, etc. The portion 602A includes passive components, e.g., a plurality of inductors I1 and I2 and a capacitor, etc., which are coupled with each other. The capacitor of the portion 602A is coupled in series with the inductor I1. Moreover, the portion 602B includes passive components, e.g., a plurality of inductors I3 and I4 and a capacitor, etc., which are coupled with each other. The inductor I4 of the portion 602B is coupled in series with the capacitor of the portion 602B. Moreover, the inductors I1, I2, I3, and I4 are twisted and wound with each other so that mutual coupling is achieved between the inductors I1, I2, I3, and I4. When the mutually coupling is established, a resonant frequency of a combination of the capacitor of the portion 602A and the inductor I1 is transferred via the inductor I2 and the inductor I3 to the inductor I4 and a resonant frequency of a combination of the capacitor of the portion 602B and the inductor I4 is transferred via the inductor I3 and the inductor I2 to the inductor I1.

When the load element LE1 is a heater element, a node of the load element LE1 is coupled via the inductor I1 to a power supply, e.g., an AC power supply, a DC power supply, etc., and another node of the load element LE1 is coupled via the inductor I2 to the power supply. Moreover, when the load element LE2 is a heater element, a node of the load element LE2 is coupled via the inductor I4 to a power supply and another node of the load element LE2 is coupled via the inductor I3 to the power supply. When the load element LE1 is a stator winding of the motor, a node of the load element LE1 is coupled via the inductor I1 to a power source, e.g., the AC power source, the DC power source, etc., and another node of the load element LE1 is coupled via the inductor I2 to the power source. Moreover, when the load element LE2 is a stator winding of the motor, a node of the load element LE2 is coupled via the inductor I4 to the power source and another node of the load element LE2 is coupled via the inductor I3 to the power source.

During operation, a signal, e.g., an AC signal, a DC signal, etc., is transferred via the inductors I1 and I2 of the portion 602A and a signal, e.g., an AC signal, a DC signal, etc., is transferred via the inductors I3 and I4 of the portion 602B. A combination of the capacitor of the portion 602A and the inductor I1 operates at the resonance frequency f1. Also, a combination of the capacitor of the portion 602B and the inductor I4 operates at the resonance frequency f2. The transfer of the signal via the inductor I1 generates an electromagnetic field, which couples with the inductors I2, I3 and I4. The transfer of the signal via the inductor I4 generates another electromagnetic field, which couples with the inductors I3, I2, and I1. The electromagnetic field generated by the transfer of the signal via the inductor I1 creates a voltage across the inductor I2, a voltage across the inductor I3, and a voltage across the inductor I4 and in an embodiment, the creation of the voltages is sometimes referred to herein as mutual coupling. Similarly, the electromagnetic field generated by the transfer of the signal via the inductor I4 creates a voltage across the inductor I3, a voltage across the inductor I2, and a voltage across the inductor I1, and in some embodiments, the creation of the voltage is sometimes referred to herein as mutual coupling.

When mutual coupling is achieved between the portion 602A and the portion 602B, the filter 602 operates at or close to, e.g., within 2 percent of, etc., the resonant frequency f1 of the series combination of the capacitor of the portion 602A and the inductor I1 and at or close to the resonant frequency f2 of the series combination of the capacitor of the portion 602B and the inductor I4. For example, when a coefficient of coupling k between the portions 602A and 602B is 1 or close to 1, e.g., greater than 0.9, etc., the mutually induced filter 602 operates at the resonant frequencies f1 and f2.

It should be noted that RF power from the signals that are transferred via the portions 602A and 602B is filtered by the filter 602. For example, RF power from an AC signal that is supplied from the AC power source to the motor and from an AC signal that is received from the motor is filtered by the filter 602. As another example, RF power from an AC signal that is supplied from an AC power supply to the heater element HE1 and from an AC signal that is received from the heater element HE1 is filtered by the filter 602.

In one embodiment, the load element LE1 is a thermocouple and a node, e.g., a sensing junction, etc., of the load element LE1 is coupled to the temperature controller via the inductor I1 and another node, e.g., a reference junction, etc., of the load element LE1 is coupled to the temperature controller via the inductor I2. RF power from a signal that is received from the sensing junction of the load element LE1 and from a signal that is received from the reference junction of the load element LE1 is filtered by the filter 602. Similarly, in the embodiment, the load element LE2 is a thermocouple and a node, e.g., a sensing junction, etc., of the load element LE2 is coupled to the temperature controller via the inductor I3 of the portion 602B and another node, e.g., a reference junction, etc., of the load element LE2 is coupled to the temperature controller via the inductor I4 of the portion 602B. RF power from an AC signal that is received from the sensing junction of the load element LE2 and from an AC signal that is received from the reference junction of the load element LE2 is filtered by the filter 602.

In one embodiment, the capacitor of the portion 602B is excluded from the filter 602. In this embodiment, the filter 602 operates at the resonant frequency f1 of the series combination of the capacitor of the portion 602A and the inductor I1.

In an embodiment, the capacitor of the portion 602A is excluded from the filter 602. In this embodiment, the filter 602 operates at the resonant frequency f2 of the series combination of the capacitor of the portion 602B and the inductor I4.

Figure 7:
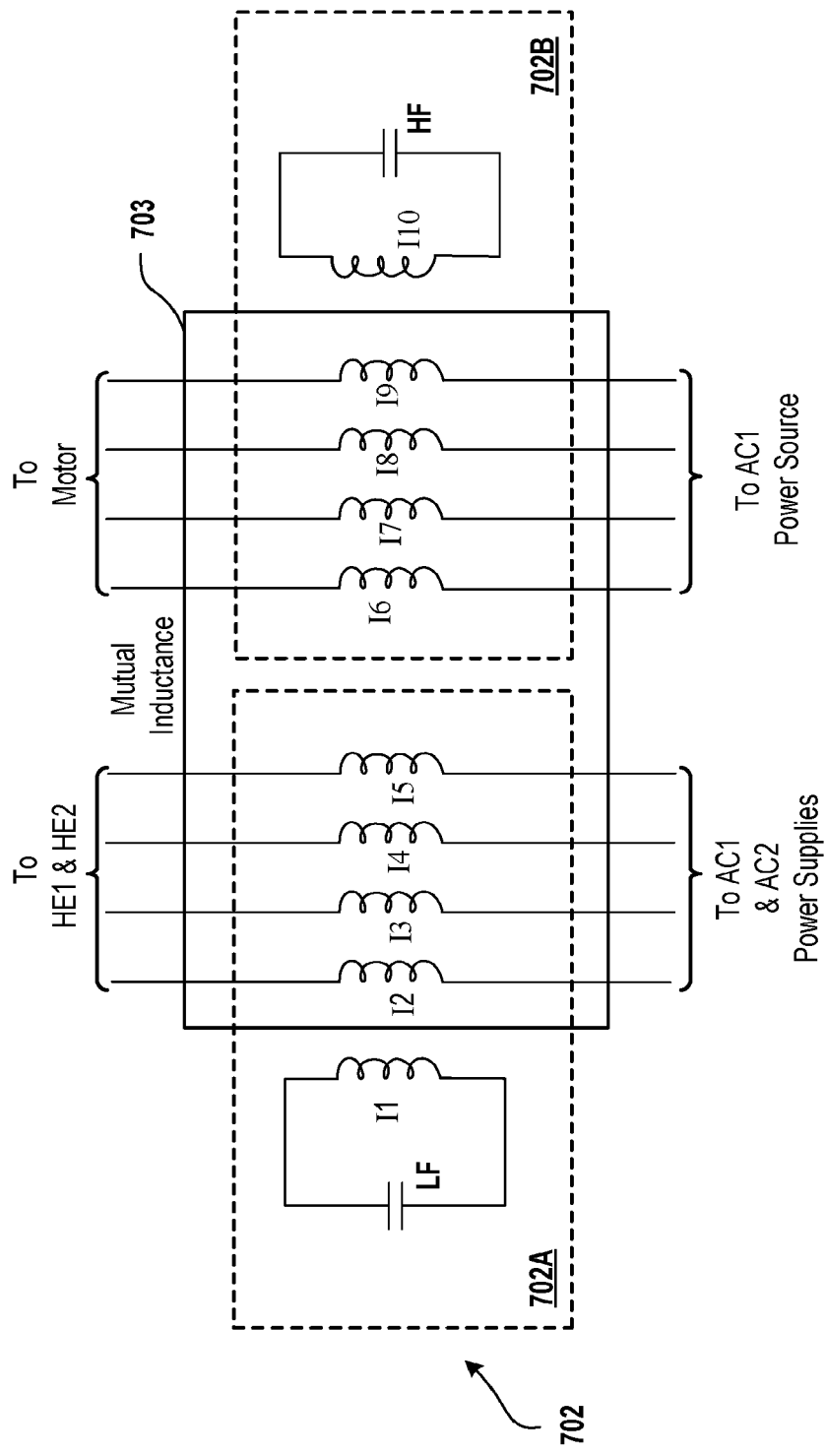
FIG. 7 is a diagram of an embodiment of a mutually induced filter to illustrate that mutual coupling is achieved between a first portion of the mutually induced filter that filters RF power from signals transferred between heater elements and power supplies and a second portion of the mutually induced filter that filters RF power from signals transferred between the motor and an AC power source, in accordance with some embodiments described in the present disclosure.

FIG. 7 is a diagram of an embodiment of a mutually induced filter 702 to illustrate that mutual coupling is achieved between portions 702A and 702B that are used to filter RF power from AC signals transferred between the heater elements HE1 and HE2 and the AC power supplies AC1 and AC2. The portions 702A and 702B are also used to filter RF power from AC signals transferred between the motor and the AC power source. The portions 702A and 702B are collectively referred to as the mutually induced filter 702.

Inductors I1, I2, I3, I4, I5, I6, I7, I8, I9, and I10 of the mutually induced filter 702 are twisted together to mutually couple the inductors. The resonant frequency f1 of the series combination of the capacitor and the inductor of the portion 702A is coupled from the inductor I1 via the inductors I2 thru I9 to the inductor I10 to mutually couple the resonant frequency f1 to the portion 702B from the portion 702A. Moreover, the resonant frequency f2 of the series combination of the capacitor and the inductor I10 of the portion 702B is coupled from the inductor I10 via the inductors I9, I8, I7, I6, I5, I4, I3, and I2 to the inductor I1 to mutually couple the resonant frequency f2 to the portion 702A from the portion 702B.

It should be noted that a block 703 around the inductors I2 thru I9 is shown to illustrate mutual inductance between the inductors.

In one embodiment, instead of the portion 702B being coupled to the motor and the AC power source, the portion 702B is coupled between the thermocouples TC1 and TC2 and the temperature controller. The portion 702B filters signals that are sensed by the thermocouples TC1 and TC2.

It should be noted that in one embodiment, instead of the heater elements HE1 and HE2 being coupled to the AC power supplies AC1 and AC2, the heater elements are coupled to DC power supplies. In an embodiment, instead of the motor being coupled to the AC power source, the motor is coupled to the DC power source.

FIG. 8A is an embodiment of a graph 800 and FIG. 8B is an embodiment of a circuit diagram of a mutually induced filter 804 to illustrate that the resonant frequency f1 is transferred from a serially-coupled section S1 of the portion 804A via the inductor I1 and the inductor I2 to the inductor I3. The mutually induced filter includes portions 804A and 804B. The graph 800 plots attenuation of RF power in decibels (dB) caused by the serially-coupled section S of the portion 804A, caused by the inductor I1, caused by the inductor I2, and caused by the inductor I3 versus frequency, which is calculated in megahertz (MHz). Mutual coupling between inductors I0 thru I3 results in coupling of the resonant frequency f1 of the series combination of the capacitor and the inductor I0 of the serially-coupled section S1 from the inductor I0 to the inductors I1, I2, and I3.

It should be noted that the graph 800 represents attenuation of RF power by each of the inductors I1 thru I3 that are twisted with each other and with the inductor I0, and represents attenuation by the serially-coupled section S1. The twisting is performed manually. In case the twisting is done using a machine, and the inductors I0 thru I3 have the same inductance, e.g., the same length, the same wire diameter, same number of windings, same pitch of twisting each wire for each inductor, same material, etc., the attenuation provided by the serially-coupled section S1 and the inductors I1 thru I3 is the same or substantially the same.

Moreover, when two inductors are twisted with a defined pitch, mutual inductance is the same or substantially the same, e.g., within 2 percent, etc., as that of individual inductance of each of the inductors. The mutual inductance increases inductance offered by each inductor by two times if the mutual inductance is the same as the individual inductance. Also, parasitic coupling between the two inductors is the same or substantially the same, e.g., within 2 percent, etc.

It should be noted that a block 803 around the inductors I1 thru I3 is shown to illustrate mutual inductance between the inductors.

Furthermore, it should be noted that in one embodiment, one end of the inductor I0 of the serially-coupled section S1 is coupled to the heating element HE1 and to the capacitor of the serially-coupled section S and another end of the inductor I0 is coupled to a power supply, e.g., the AC power supply AC1, a DC power supply DC1, etc., and to the capacitor of the serially-coupled section S1. Also, the inductor I1 is connected to the heating element HE1 at one end and to the power supply, e.g., the AC power supply AC1, the DC power supply DC1, etc., at the other end. The inductor I2 is connected to the heating element HE2 at one end and to a power supply, e.g., the AC power supply AC2, a DC power supply DC2, etc., at another end of the inductor I2. The inductor I3 is connected to the heating element HE2 at one end and to the power supply, e.g., the AC power supply AC2, the DC power supply DC2, etc., at the other end of the inductor I3.

In an embodiment, one end of the inductor I0 is coupled to the sensing junction of the thermocouple TC1 and to the capacitor of the serially-coupled section S1 and another end of the inductor I0 is coupled to the temperature controller and to the capacitor of the serially-coupled section S1. Also, in this embodiment, the inductor I1 is connected to the reference junction of the thermocouple TC1 at one end and to the temperature controller at another end. The inductor I2 is connected to the sensing junction of the thermocouple TC2 at one end and to the temperature controller at another end. The inductor I3 is connected to the reference junction of the thermocouple TC2 at one end and to the temperature controller at another end.

In an embodiment, one end of the inductor I0 is coupled to a first winding of the stator of the motor and to the capacitor of the serially-coupled section S and another end of the inductor I0 is coupled to the first phase of a power source, e.g., the AC power source, the DC power source, etc., and to the capacitor of the serially-coupled section S1. Also, the inductor I1 is connected to the first winding at one end and to the power source at another end. The inductor I2 is connected to a second winding of the stator at one end and to the AC power source at another end. The inductor I3 is connected to the second winding at one end and to the AC power source at another end.

Figure 9:
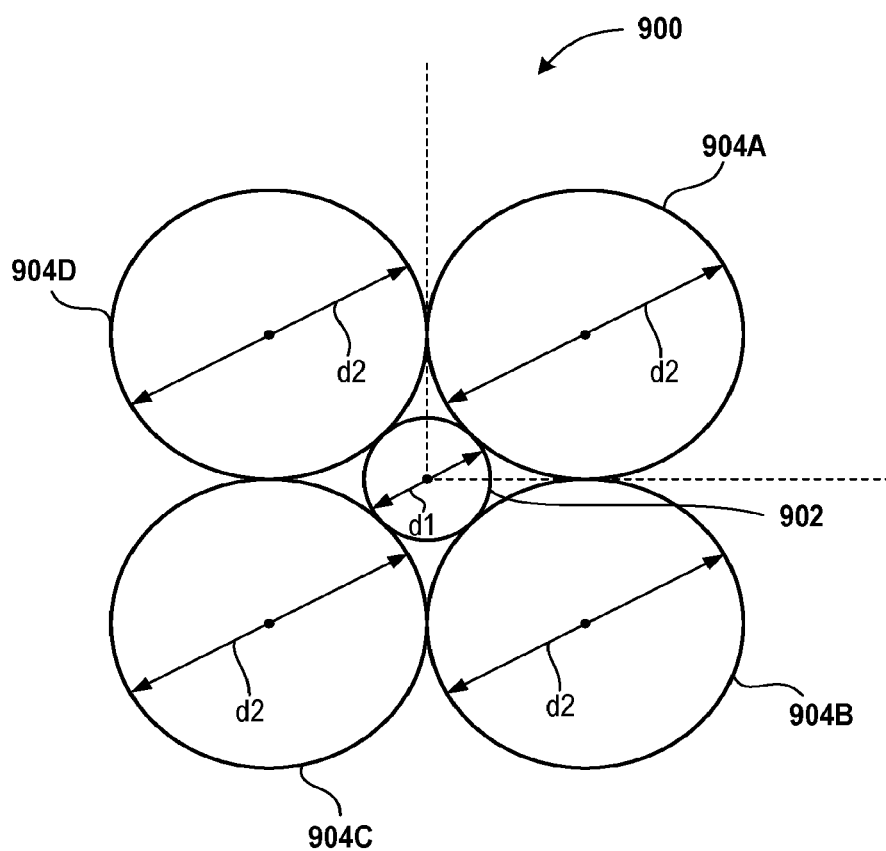
FIG. 9 is a diagram illustrating a cross-section of a filter, in accordance with some embodiments described in the present disclosure.

FIG. 9 is a diagram illustrating a cross-section of a mutually induced filter 900, e.g., an inductor, etc. The mutually induced filter 900 includes a filter component 902, e.g., an inductor coupled to a capacitor, etc., and multiple inductors 904A, 904B, 904C, and 904D. A wire of each of the inductors 904A thru 904D is thicker than a wire of the inductor of the filter element 902. For example, a diameter d1 of the filter component 902, e.g., an inductor, etc., is less than a diameter d2 of each of the inductors 904A thru 904D. In one embodiment, diameters of the inductors 904A thru 904D are different from each other and the diameters are greater than the diameter d1. A minimal amount of current passes through the filter element 902 and a higher amount of current passes through each of the inductors 904A thru 904D. The higher amount of current is an amount that is greater than the minimal amount of current. For example, each of inductors 904A and 904C is connected to a separate power supply, e.g., an AC power supply, a DC power supply, etc., for receiving a signal from the power supply and each of inductors 904B and 904D provides a path for return of a signal from a separate resistive element. When there is mutually coupling between the inductors of the filter element and the inductors 904A thru 904D, the mutually induced filter 900 filters RF power from supply signals generated by the power supplies connected to the inductors 904A and 904C and also filters RF power from return signals that are returned from the resistive elements. RF power from the supply and return signals is filtered at a resonant frequency of the filter element 902. To achieve the mutual coupling, the wire of the filter element 902 is twisted with wires of the inductors 904A thru 904D and then wound to form the inductor of the filter elements 902 and the inductors 904A thru 904D, and then the inductor of the filter element 902 is connected to the capacitor of to fabricate the mutually induced filter 900. As another example, the inductors 904A and 904C are connected to reference junctions of two thermocouples and the inductors 904B and 904D are connected to sensing junctions of the thermocouples. RF power from signals generated when the thermocouples sense temperature differences are filtered by the filter element 902. As yet another example, each inductor 904A and 904C is connected to a power source, e.g., the AC power source, the DC power source, etc., and each inductor 904B and 904D provides a path for return from a separate stator winding of the motor. The filter element 902 filters RF power from signals generated by the power source connected to the inductors 904A and 904C and also filters RF power from return signals that are returned from the stator windings.

The use of the filter element 902 that is not directly connected to a power supply or a power source or to a resistive element or to a winding protects the filter element 902 from excessive current. Also, the mutually induced filter 900 in which the filter element 902 has a smaller cross-sectional thickness is more compact than a package in which a filter element is of the same thickness as that of each of the inductors 904A, 904B, 904C, and 904D.

Figure 10A:
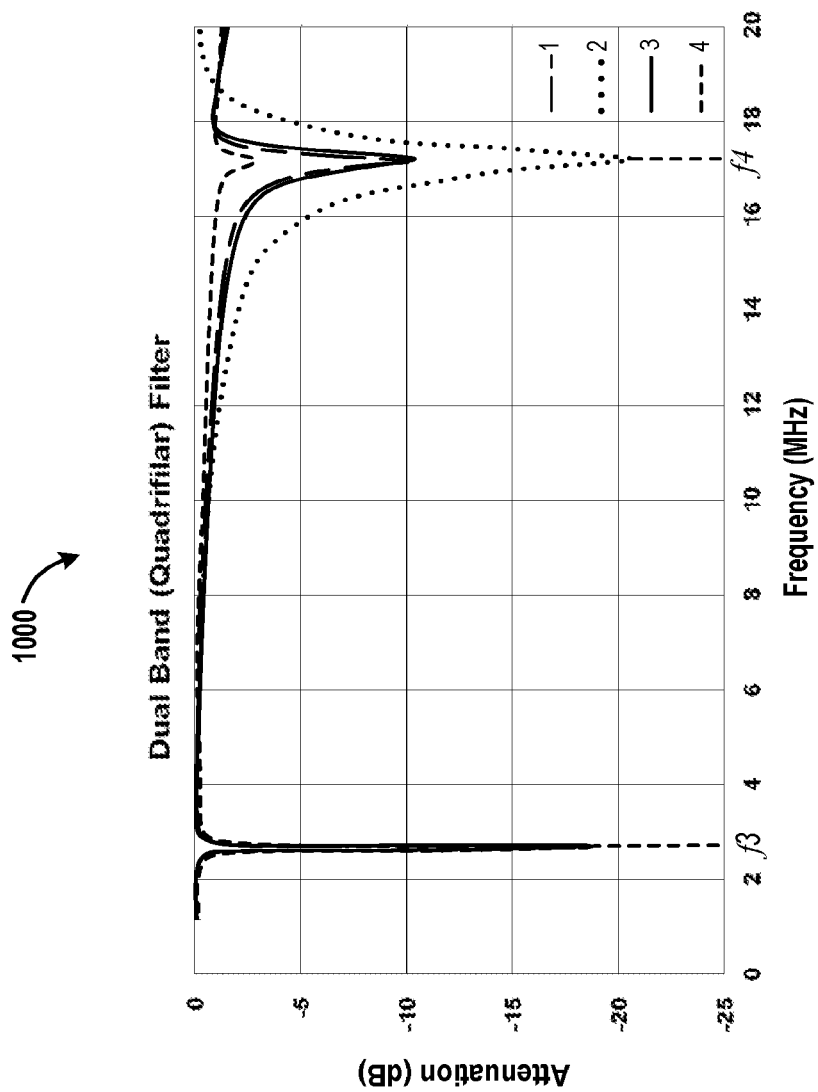
FIG. 10A is a diagram of a graph for illustrating similar attenuation by a dual frequency mutually induced filter and exhibition of similar resonant frequencies by components of the dual frequency induced filter, in accordance with various embodiments described in the present disclosure.
Figures 1, 10B:
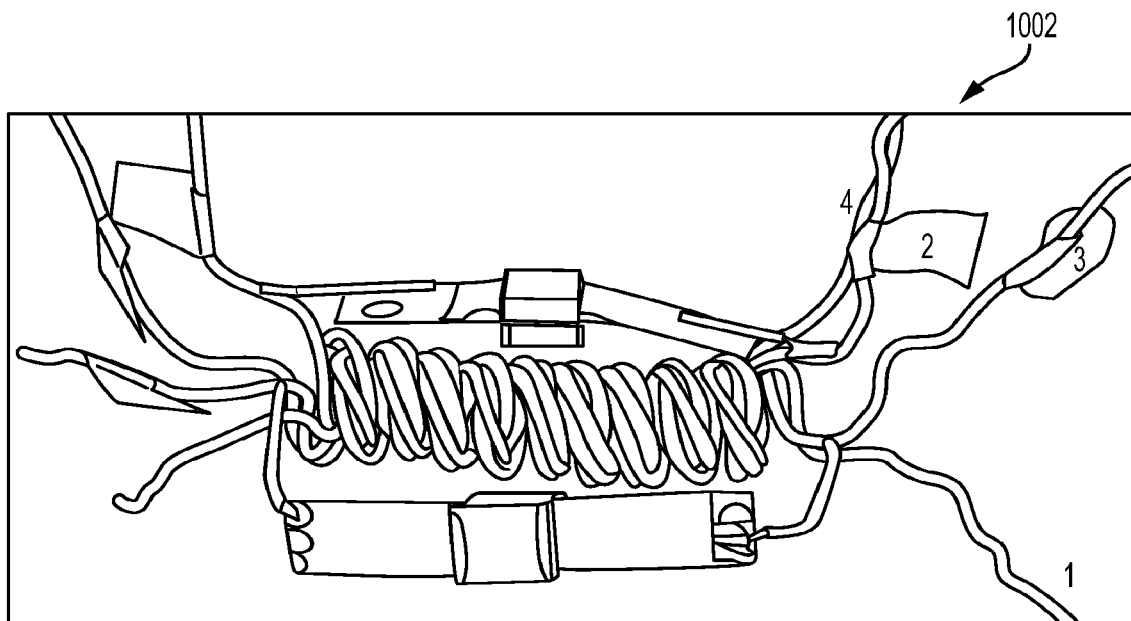
Figures 2, 10B:
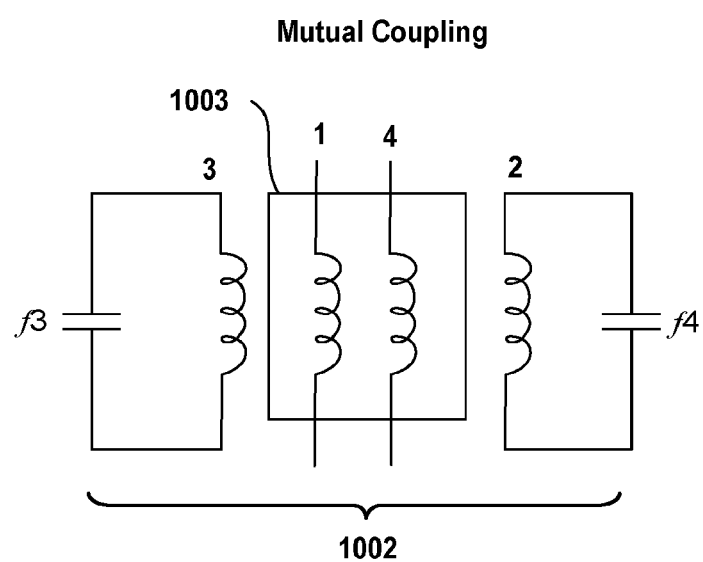
Figure 11B:
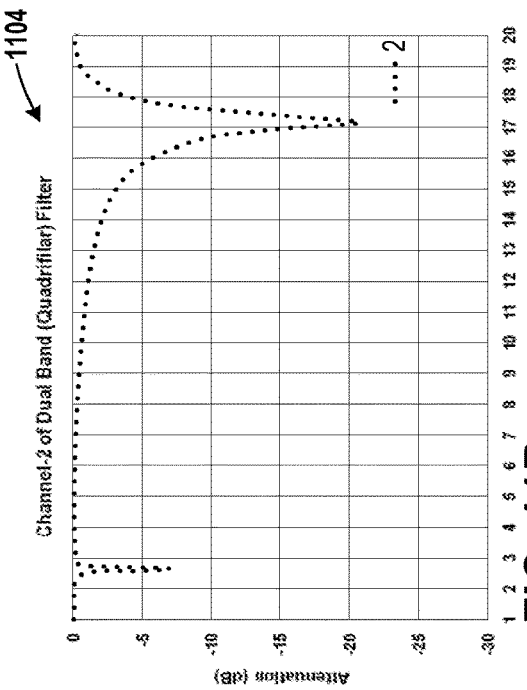
FIG. 11B shows a graph to illustrate an attenuation associated with another channel of the dual band mutually induced filter of FIG. 11A, in accordance with some embodiments described in the present disclosure.
Figure 11D:
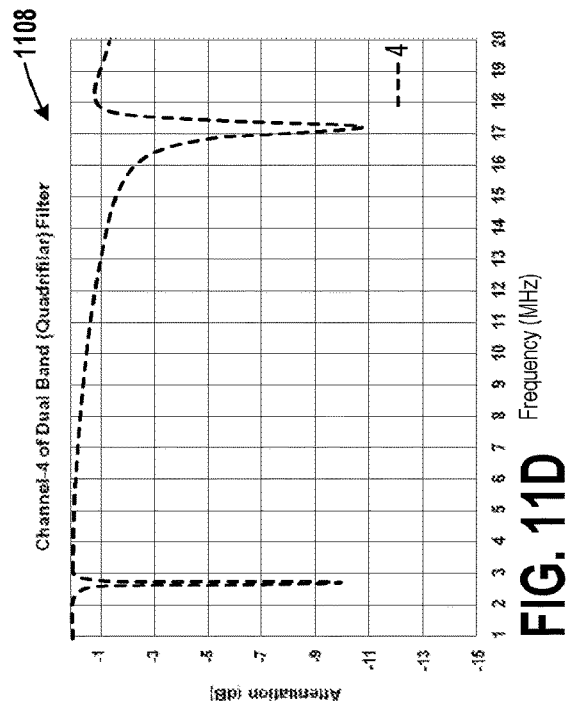
FIG. 11D shows a graph to illustrate an attenuation associated with another channel of the dual band mutually induced filter of FIG. 11A, in accordance with some embodiments described in the present disclosure.
Figure 11A:
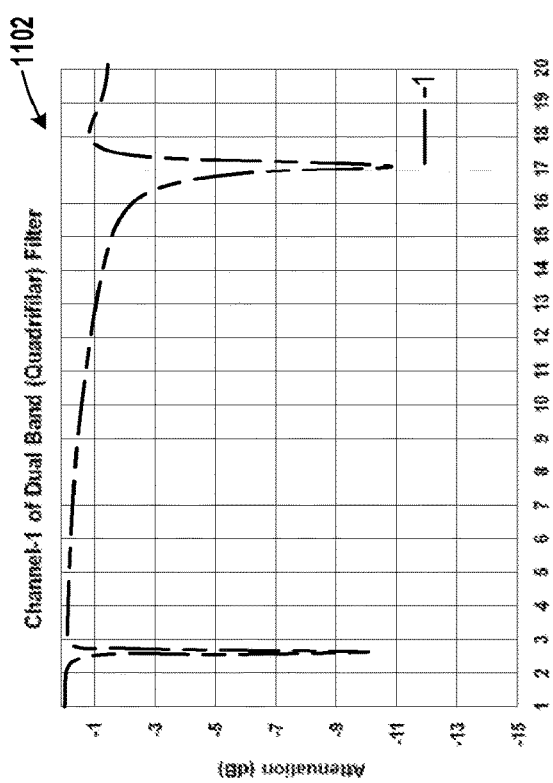
FIG. 11A shows a graph to illustrate an attenuation associated with a channel of the dual band mutually induced filter, in accordance with some embodiments described in the present disclosure.
Figure 11C:
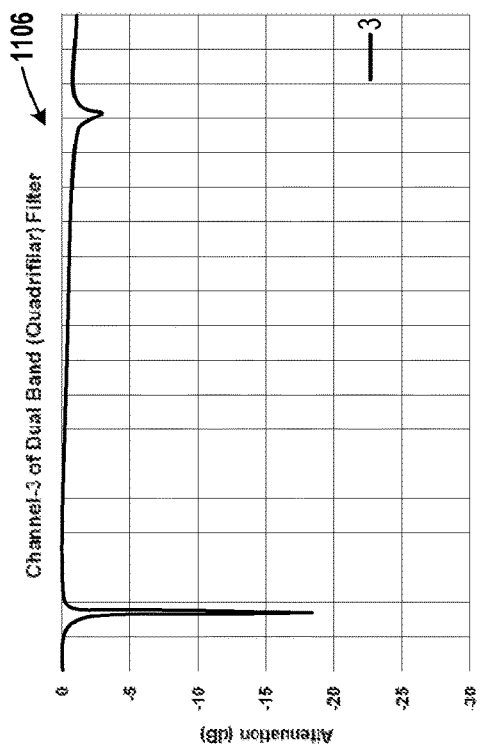
FIG. 11C shows a graph to illustrate an attenuation associated with yet another channel of the dual band mutually induced filter of FIG. 11A, in accordance with some embodiments described in the present disclosure.

FIG. 10A is a diagram of an embodiment of a graph 1000 for illustrating similar attenuation of RF power by mutually coupled inductors and exhibition of same resonant frequencies f1 and f2 by components of a mutually induced filter 1002. The graph 1000 illustrates attenuation of RF power by an inductor and a capacitor of a channel 1, an inductor of a channel 2, an inductor of a channel 3, and an inductor and a capacitor of a channel 4. The inductors and the capacitors are of the mutually induced filter 1002, a prototype of which is illustrated in FIG. 10B-1. Band rejection filtering characteristics of the mutually induced filter 1002 are illustrated in FIG. 10A. Also, a circuit diagram of the mutually induced filter 1002 is illustrated in FIG. 10B-2.

As shown in the prototype, four inductors are fabricated by twisting four wires to form a unitary body, which is then wound to change the shape of the unitary body from straight to spiral to change a shape of the unitary body. A first one of the four inductors is connected in series to two capacitors and a second one of the four inductors is connected in series with a single capacitor to fabricate the prototype of the mutually induced filter 1002. The two capacitors are connected in parallel with each other, and a combination of the two capacitors and the inductor that is connected in series with the two capacitors have a resonant frequency f3. A combination of the second inductor and the capacitor that is connected in series with the second inductor have a resonant frequency f4.

The inductor of the channel 3 is mutually coupled with the inductors of the channels 1, 2, and 4 and the mutual coupling results in coupling of the resonant frequency f3 from the inductor of the channel 3 to the inductors of the channels 1, 2, and 4. Also, the inductor of the channel 2 is mutually coupled with the inductors of the channels 1, 3, and 4 and the mutual coupling results in coupling of the resonance frequency f4 from the inductor of the channel 2 to the inductors of the channels 1, 3, and 4. Mutual coupling between the inductors of the channels 1, 2, 3, and 4 results in similar or the same attenuation by the inductor and the capacitors of the channel 3, the inductor of the channel 1, the inductor of the channel 4, and the inductor and the capacitor of the channel of the channel 2.

It should be noted that a block 1003 around the inductors connected to the channels 1 and 4 is shown to illustrate mutual inductance between the inductors.

It should be noted that as shown in the graph 1000, attenuation provided by the inductor and the capacitors of the channel 3 at the frequency f3 is greater, e.g., more negative, etc., than attenuations provided by the inductors of the channels 1 and 4 at the frequency f3. The capacitors of the channel 3 increase the attenuation associated with the channel 3 compared to attenuation provided by the channel 1 or 4. Similarly, attenuation provided by the inductor and the capacitor of the channel 2 at the frequency f4 is greater than attenuations provided by the inductors of the channels 1 and 4 at the frequency f4. The capacitor of the channel 2 increases the attenuation provided by the channel 2 compared to attenuation provided by the channel 1 or 4. Difference between an attenuation provided by a channel that is connected to a capacitor and a channel that is not, e.g., a channel connected to an inductor without being connected to a capacitor, etc., depends upon a variable K, which is a ratio of L and M, where L is inductance of the each inductor of each channel and M is a mutual inductance between the two inductors. Moreover, the difference depends upon parameters of wires of the inductors, e.g., resistive loss of wires of the inductors, etc.

It should further be noted that in one embodiment, if inductance of each of the inductors of the channels 1 and 4 is the same, e.g., the inductors have the same wire diameter, the same wire length, the same wire material, etc., and if the mutual coupling is 100% or substantially close to 100%, e.g., 99% to 100%, etc., attenuation provided by the inductors of the channels 1 and 4 is the same or substantially the same, e.g., within 2%, etc., at each of the frequencies f3 and f4.

In an embodiment, f3 is different from f4. In one embodiment, f3 is the same as f4.

It should further be noted that although two frequencies f3 and f4 are shown, in one embodiment, more than two frequencies are used. For example, in case of N+M channels, M is a number of resonant frequencies and N is a number of outputs of the channels. Each of N and M is an integer greater than zero. The outputs either receive power from a power supply or a power source or supply power to a load.

In one embodiment, instead of the two capacitors of the channel 3 being coupled to each other in parallel, one capacitor is used or any other number of capacitors is coupled in parallel. In an embodiment, instead of the two capacitors of the channel 3 being coupled to each other in parallel, the two capacitors of any other number of capacitors are coupled in series with each other.

Similarly, in an embodiment, instead of the capacitor of the channel 2, a number of capacitors coupled in series with each other or parallel to each other is used.

FIGS. 11A, 11B, 11C, and 11D show embodiments of graphs 1102, 1104, 1106, and 1108 to illustrate attenuations associated with the channels 1, 2, 3, and 4 separately. Data within the graph 1000 (FIG. 10A) is segregated to provide for better visibility of data associated with each channel 1, 2, 3, and 4 in the graphs 1102, 1104, 1106, and 1108.

Figure 12:
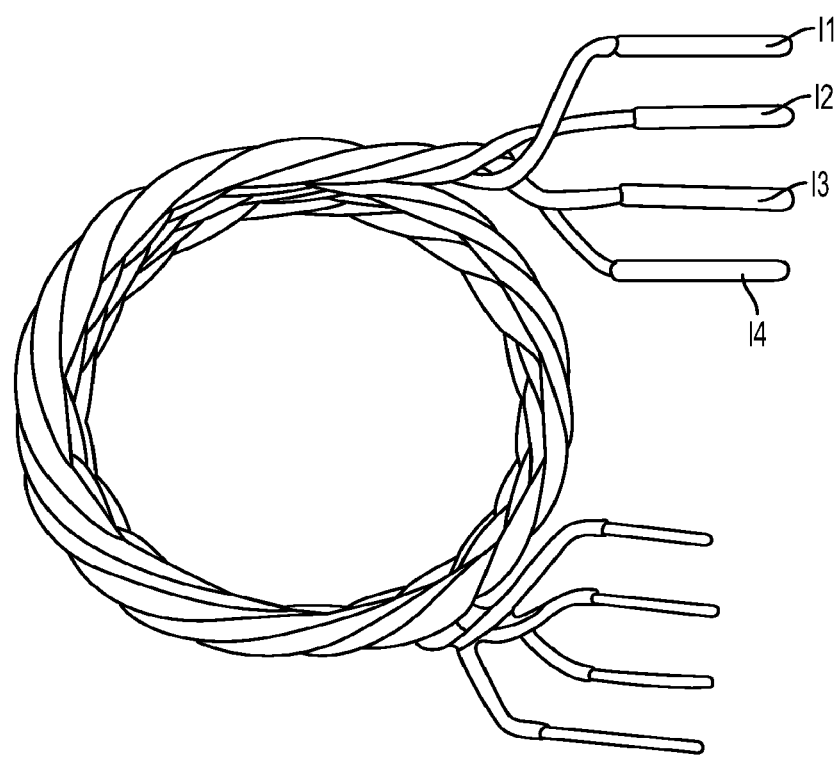
FIG. 12 is a diagram to illustrate twisting and winding of four inductors during fabrication of a mutually induced filter, in accordance with some embodiments described in the present disclosure.

FIG. 12 is a diagram to illustrate twisting and winding of four inductors I1 thru I4 to create a portion of a mutually induced filter. As shown, four wires are twisted with each other at a defined pitch and then are wound to form the four inductors I1 thru I4 that are mutually coupled with each other to form a portion of a mutually induced filter.

In an embodiment, any number of inductors, other than four, is twisted at a pre-defined pitch and is wound to form a portion of a mutually induced filter.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A mutually induced filter, comprising:
a first circuit configured to be coupled to a first load element, wherein the first circuit includes:
a first inductor having a first end and a second end; and
a first frequency filter coupled in parallel to the first inductor;
a second inductor having a first end and a second end, wherein the first ends of the first and second inductors are configured to be coupled to a first power supply; and
a second circuit configured to be coupled to a second load element, wherein the first inductor, the second inductor, and a portion of the second circuit are twisted with each other to enable a transfer of a first resonant frequency associated with the first circuit to the second circuit.

2. The mutually induced filter of claim 1, wherein the first load element is a heater and the second load element is a heater, wherein the heaters of the first and second load elements are embedded within a pedestal of a plasma chamber.

3. The mutually induced filter of claim 1, wherein the second end of the first inductor is configured to be coupled to the first load element, wherein the second end of the second inductor is configured to be coupled to the first load element.

4. The mutually induced filter of claim 1, wherein the first frequency filter is a first capacitor, wherein the second circuit includes a second capacitor, and the portion of the second circuit includes a first inductor and a second inductor, wherein the first inductor of the second circuit has a first end and a second end, wherein the second capacitor is coupled to the first and second ends of the first inductor of the portion of the second circuit.

5. The mutually induced filter of claim 4, wherein the first and second inductors of the first circuit and the first and second inductors of the portion of the second circuit are twisted with each other to form one unitary body.

6. The mutually induced filter of claim 1, wherein the portion of the second circuit includes a first inductor having a first end and a second end and a second inductor having a first end and a second end, wherein the first end of the first inductor of the second circuit is configured to be coupled to a second power supply and the second end of the first inductor of the second circuit is configured to be coupled to the second load element.

7. The mutually induced filter of claim 6, wherein the first end of the second inductor of the second circuit is configured to be coupled to the second power supply and the second end of the second inductor of the second circuit is configured to be coupled to the second load element.

8. The mutually induced filter of claim 1, wherein the first frequency filter is a capacitor, wherein the second circuit includes a second frequency filter, wherein the second frequency filter is a capacitor, wherein the first resonant frequency is of the capacitor of the first frequency filter and the first inductor.

9. The mutually induced filter of claim 1, wherein the first inductor, the second inductor, and the portion of the second circuit are twisted with each other to enable a transfer of a second resonant frequency associated with the second circuit to the first circuit.

10. A mutually induced filter, comprising:
a first circuit configured to be coupled to a first thermocouple, wherein the first circuit includes:
a first inductor having a first end and a second end; and
a first frequency filter coupled to the first end of the first inductor and to the second end of the first inductor;
a second inductor having a first end and a second end, wherein the first ends of the first and second inductors are configured to be coupled to a temperature controller; and
a second circuit configured to be coupled to a second thermocouple, wherein the first inductor, the second inductor, and a portion of the second circuit are twisted together lengthwise with each other to enable a transfer of a first resonant frequency associated with the first circuit to the second circuit.

11. The mutually induced filter of claim 10, wherein the first and second thermocouples are in contact with a pedestal of a plasma chamber.

12. The mutually induced filter of claim 10, wherein the second end of the first inductor is configured to be coupled to the first thermocouple, wherein the second end of the second inductor is configured to be coupled to the first thermocouple.

13. The mutually induced filter of claim 10, wherein the first frequency filter is a first capacitor, wherein the second circuit includes a second capacitor, and the portion of the second circuit includes a first inductor and a second inductor, wherein the first inductor of the second circuit has a first end and a second end, wherein the second capacitor is coupled to the first and second ends of the first inductor of the portion of the second circuit.

14. The mutually induced filter of claim 10, wherein the portion of the second circuit includes a first inductor having a first end and a second end and a second inductor having a first end and a second end, wherein the first end of the first inductor of the second circuit is configured to be coupled to a second temperature controller and the second end of the first inductor of the second circuit is configured to be coupled to the second thermocouple.

15. The mutually induced filter of claim 10, wherein the portion of the second circuit includes a first inductor and a second inductor, wherein the first and second inductors of the first circuit and the first and second inductors of the second circuit are twisted together lengthwise with each other to enable a transfer of a second resonant frequency associated with the second circuit to the first circuit.

16. A mutually induced filter, comprising:
a first circuit configured to be coupled to a motor, wherein the first circuit includes:
a first inductor having a first end and a second end; and
a first frequency filter coupled to the first end of the first inductor and to the second end of the first inductor;

a second inductor having a first end and a second end, wherein the first ends of the first and second inductors are configured to be coupled to a power supply; and a second circuit configured to be coupled to the motor, wherein the first inductor, the second inductor, and a portion of the second circuit are wound together with each other to enable a transfer of a first resonant frequency associated with the first circuit to the second circuit.

17. The mutually induced filter of claim 16, wherein the motor is coupled to a pedestal of a plasma chamber to rotate the pedestal.

18. The mutually induced filter of claim 16, wherein the second end of the first inductor is configured to be coupled to the motor, wherein the second end of the second inductor is configured to be coupled to the motor.

19. The mutually induced filter of claim 16, wherein the first frequency filter is a first capacitor, wherein the second circuit includes a second capacitor, and the portion of the second circuit includes a first inductor and a second inductor, wherein the first inductor of the second circuit has a first end and a second end, wherein the second capacitor is coupled to the first and second ends of the first inductor of the portion of the second circuit.

20. The mutually induced filter of claim 16, wherein the portion of the second circuit includes a first inductor having a first end and a second end and a second inductor having a first end and a second end, wherein the first end of the first inductor of the second circuit is configured to be coupled to the power supply and the second end of the first inductor of the second circuit is configured to be coupled to the motor.

21. The mutually induced filter of claim 20, wherein the first end of the second inductor of the second circuit is configured to be coupled to the power supply and the second end of the second inductor of the second circuit is configured to be coupled to the motor.

22. The mutually induced filter of claim 16, wherein the first frequency filter is a first capacitor, wherein the second circuit includes a first inductor, a second inductor, and a second frequency filter, wherein the second frequency filter is a second capacitor, wherein the first resonant frequency is of the first capacitor and the first inductor, wherein the first and second inductors of the first circuit and the first and second inductors of the second circuit are twisted with each other to enable a transfer of a second resonant frequency associated with the second circuit to the first circuit.

* * * * *